US 9,285,393 B2

(12) United States Patent
Kikuchi et al.

(10) Patent No.: US 9,285,393 B2
(45) Date of Patent: Mar. 15, 2016

(54) HANDLER APPARATUS AND TEST METHOD

(71) Applicant: ADVANTEST CORPORATION, Tokyo (JP)

(72) Inventors: Hiroyuki Kikuchi, Gunma (JP); Mitsunori Aizawa, Saitama (JP)

(73) Assignee: ADVANTEST CORPORATION, Tokyo (JP)

( * ) Notice: Subject to any disclaimer, the term of this patent is extended or adjusted under 35 U.S.C. 154(b) by 623 days.

(21) Appl. No.: 13/676,133

(22) Filed: Nov. 14, 2012

(65) Prior Publication Data

US 2013/0181733 A1    Jul. 18, 2013

(30) Foreign Application Priority Data

Jan. 13, 2012 (JP) ................................. 2012-004889

(51) Int. Cl.
| G01R 1/04 | (2006.01) |
| G01R 31/02 | (2006.01) |
| G01R 31/01 | (2006.01) |
| G01R 31/28 | (2006.01) |

(52) U.S. Cl.
CPC ............ *G01R 1/0433* (2013.01); *G01R 1/0466* (2013.01); *G01R 31/02* (2013.01); *G01R 31/2874* (2013.01); *G01R 31/2893* (2013.01); *G01R 31/01* (2013.01); *G01R 31/2867* (2013.01)

(58) Field of Classification Search
CPC .... G01R 1/0466; G01R 31/02; G01R 1/0433; G01R 31/01
USPC .................................................... 324/750.23
See application file for complete search history.

(56) References Cited

U.S. PATENT DOCUMENTS

| 6,313,654 B1 * | 11/2001 | Nansai ................... G01R 31/01 219/412 |
| 2004/0077200 A1 * | 4/2004 | Ishikawa .............. G01R 1/0458 439/190 |
| 2009/0261817 A1 * | 10/2009 | Beom ................ G01R 31/2893 324/757.01 |

(Continued)

FOREIGN PATENT DOCUMENTS

| JP | H9-129330 A | 5/1997 |
| JP | H11-052010 A | 2/1999 |
| JP | 2000-46902 A | 2/2000 |

(Continued)

OTHER PUBLICATIONS

Notice of Office Action for Korean Patent Appl. No. 10-2012-0132613, issued by the Korean Intellectual Property Office on Nov. 12, 2013.

(Continued)

*Primary Examiner* — Jermele M Hollington
*Assistant Examiner* — Dustin Dickinson

(57) ABSTRACT

Provided is a handler apparatus which can connect devices under test to sockets of a test apparatus quickly and with low power consumption. The handler apparatus for conveying and connecting a plurality of devices under test to a plurality of sockets provided on a test head of a test apparatus, includes a position adjusting section that moves each of the plurality of devices under test on the test tray and adjusts the position thereof to a corresponding one of the plurality of sockets; and a device mounting section that mounts the plurality of devices under test whose positions have been adjusted by the position adjusting section, to the plurality of sockets.

10 Claims, 18 Drawing Sheets

(56) References Cited

U.S. PATENT DOCUMENTS

2010/0045330 A1* 2/2010 Sleijpen et al. ............... 324/765
2011/0279136 A1* 11/2011 Shiozawa ................. 324/750.23

FOREIGN PATENT DOCUMENTS

| JP | 2000-147055 A | 5/2000 | | |
| JP | 2001-264383 A | 9/2001 | | |
| JP | 2002-207065 | * | 7/2002 | ............ G01R 31/26 |
| JP | 2004-071255 A | 3/2004 | | |
| JP | 2005-265665 | * | 9/2005 | ............ G01R 31/26 |
| JP | 2007-333697 A | 12/2007 | | |
| JP | 2009-2860 A | 1/2009 | | |
| JP | 2011-39059 A | 2/2011 | | |
| JP | 2011-40758 A | 2/2011 | | |
| JP | 2011-237446 A | 11/2011 | | |

OTHER PUBLICATIONS

Office Action issued for counterpart Japanese Application 2015-000990, issued by the Japan Patent Office on Dec. 22, 2015.

* cited by examiner

HANDLER APPARATUS AND TEST METHOD

BACKGROUND

1. Technical Field

The present invention relates to a handler apparatus and a test method.

2. Related Art

A conventional handler apparatus is connected to a test apparatus for testing a device under test, conveys the device under test mounted on a test tray, and electrically connects the device under test mounted on the test tray, to the test apparatus (e.g., refer to Patent Documents No. 1-No. 5).

Patent Document No. 1: Japanese Patent Application Publication No. 2000-147055
Patent Document No. 2: Japanese Patent Application Publication No. 2000-46902
Patent Document No. 3: Japanese Patent Application Publication No. 2009-2860
Patent Document No. 4: Japanese Patent Application Publication No. 2011-39059
Patent Document No. 5: Japanese Patent Application Publication No. 2011-40758

However, as the size and the pitch of the electrodes of a device under test become smaller, it becomes necessary for the handler apparatus to mount the device under test on the test tray with accuracy. However, it has been conventionally difficult for the handler apparatus to mount hundreds of devices under test in a short time while not compromising the accuracy.

SUMMARY

To solve the above problems, according to an aspect related to the innovations herein, provided are a handler apparatus and a test method, which are capable of overcoming the above drawbacks accompanying the related art. The above and other objects can be achieved by combinations described in the claims. A first aspect of the innovations is a handler apparatus for conveying and connecting a plurality of devices under test to a plurality of sockets provided on a test head of a test apparatus, the handler apparatus including: a position adjusting section that moves each of the plurality of devices under test on the test tray and adjusts the position of the device under test to a corresponding one of the plurality of sockets; and a device mounting section that mounts the plurality of devices under test whose positions have been adjusted by the position adjusting section, to the plurality of sockets.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
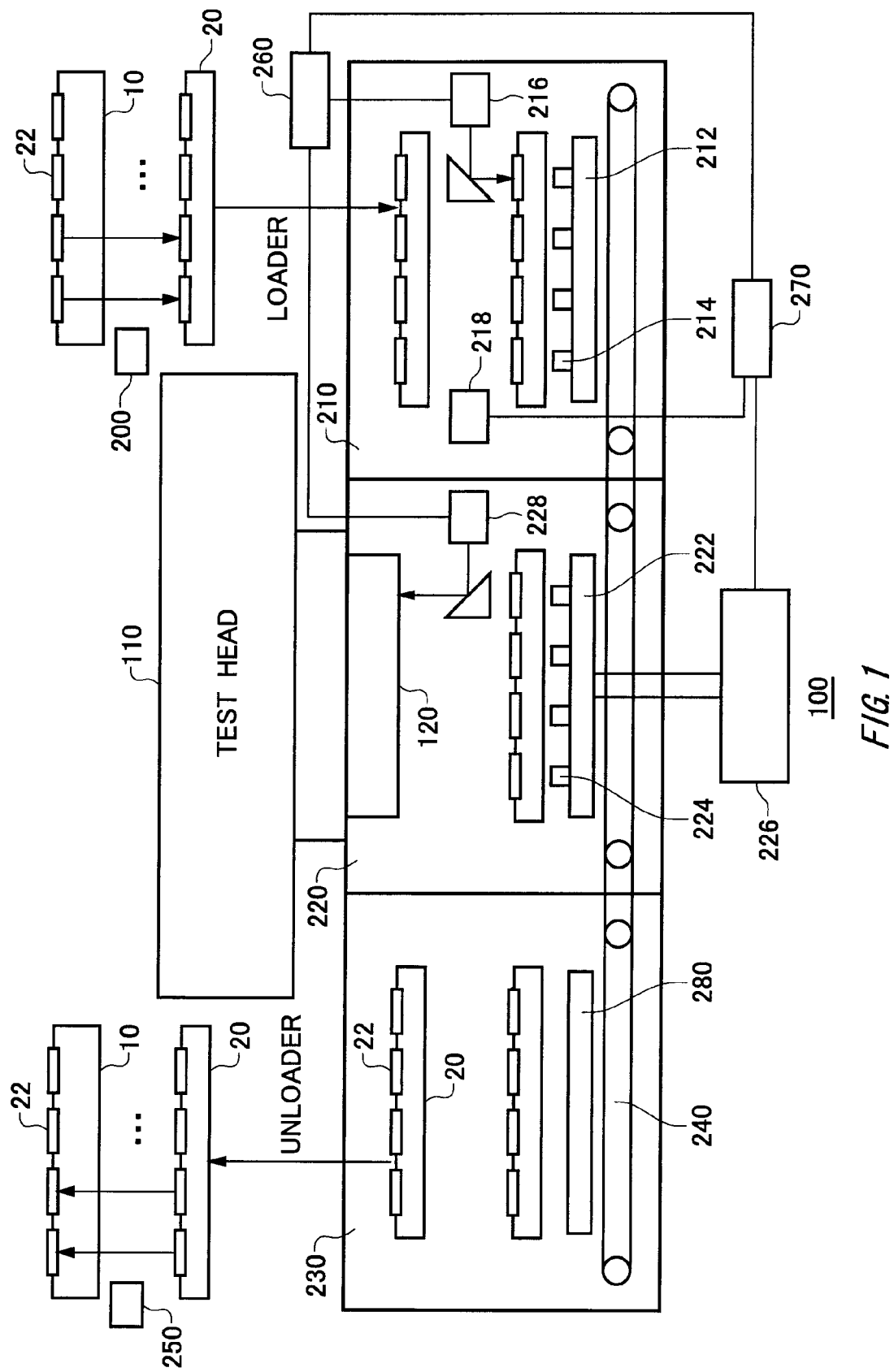
FIG. 1 shows an exemplary configuration of a handler apparatus 100 according to the present embodiment, together with a test head 110, a test tray 20, and a user tray 10.

FIG. 1 shows an exemplary configuration of a handler apparatus 100 according to the present embodiment, together with a test head 110, a test tray 20, and a user tray 10. The handler apparatus 100 is connected to the test head 110 of the test apparatus, conveys the plurality of devices under test 22, and connects them to a plurality of sockets provided for the test head 110 of the test apparatus.

Here, the test head 110 includes a socket board 120 including a plurality of sockets, and is electrically connected to the plurality of devices under test 22 via the plurality of sockets. The test head 110 is a part of the test apparatus, and the test apparatus inputs a test signal to each of the plurality of devices under test 22, and determines whether the device under test 22 is good or bad based on an output signal outputted from the device under test 22 in response to the test signal, the test signal being based on a test pattern for testing the plurality of devices under test 22

The test apparatus tests a plurality of devices under test 22 such as an analog circuit, a digital circuit, an analog/digital hybrid circuit, a memory, and a system on chip (SOC). Each device under test 22 may include an electrode such as BGA (ball grid array) or LGA (land grid array).

Each device under test 22 may alternatively include a terminal such as SOJ (small outline J-leaded), PLCC (plastic leaded chip carrier), QFP (quad flat package), or a SOP (small outline package), or the like. The socket board 120 includes a socket electrically connectable to an electrode, a terminal, or the like of the device under test 22 to be tested.

The handler apparatus 100 includes a first mounting apparatus 200, a heating section 210, a test section 220, a heat removing section 230, a conveyer 240, a second mounting apparatus 250, a detecting apparatus 260, and a controller 270. The first mounting apparatus 200 mounts a plurality of devices under test 22 from the user tray 10 to the test tray 20. The first mounting apparatus 20 may include an arm for adsorbing a device under test 22, and move the adsorbed device under test 22 from the user tray 10 to the test tray 200.

The test tray 20 may have, arranged thereon, the plurality of devices under test 22 in both row and column directions. The test tray 20 is provided by a material that would support the plurality of devices under test 22 mounted thereon and that would not crack, break, or be deformed even under the temperature conditions of the high/low temperature test conducted by the test apparatus which would lead to apply stress on the devices under test 22.

The heating section 210 includes a loader used to carry into itself the test tray 20 mounting the plurality of devices under test 22 thereon. The heating section 210 controls the temperature of the devices under test 22 to a test temperature ahead of conducting a test. In addition, the adjustment of the positions of the plurality of devices under test 22 on the test tray 20 is conducted inside the heating section 210. The heating section 210 includes a temperature controller 212, a device image capturing section 216, and a position adjusting section 218.

The temperature controller 212 mounts thereon the test tray 20, and controls the temperature of the plurality of devices under test 22 on the test tray 20. The temperature controller 212 controls the temperature of the plurality of devices under test 22 to be substantially the same temperature as prescribed in the temperature condition for the test performed by the test apparatus. The temperature controller 212 may include a plurality of temperature control units 214.

There are a plurality of temperature control units 214 provided to correspond in number to the plurality of devices under test 22. The temperature control units 214 either heat or cool the devices under test 22 independently from each other, from the surface opposite to the electrode surface or the terminal surface connected to a socket of the socket ball 120. The temperature control units 214 may be a thermoelectric device such as a Peltier device. Alternatively, the temperature control units 214 may be either a heater or a cooler for circulating a cooling medium or a heating medium.

When the temperature control units 214 directly control the temperature of the devices under test 22 independently from each other and that from their rear side, the temperature of the plurality of devices under test 22 can be controlled quickly and with low power consumption, without necessitating to control the temperature for the entire chamber. It is also possible that the temperature controller 212 control the temperature inside the heating section 210 to be substantially constant.

The device image capturing section 216 captures the image of the position on which the plurality of devices under test 22 are mounted on the test tray 20. The device image capturing section 216 may capture the image of the position for each device under test 22 or for two or more devices under test 22 collectively. The device image capturing section 216 may include a movable section to capture the plurality of devices under test 22 mounted on the test tray 20.

For example, the device image capturing section 216 may include an image capturing camera or the like, whose image capturing direction is oriented parallel to the surface on which the devices under test 22 are mounted, and captures the image of the devices under test 22 on the test tray 20 using a mirror mounted on the movable section. The mirror may have an angle of about 45 degrees with respect to the mounting surface of the test tray 20, so as to reflect the image of the devices under test 22 onto the image capturing camera.

The device image capturing section 216 may move the mirror in a direction parallel to the mounting surface of the mounting surface of the test tray 20 which is substantially the same direction as the image capturing direction of the image capturing camera position, thereby capturing the image of the mounting position of the plurality of devices under test 22 mounted in the parallel direction. The device image capturing section 216 may also capture the image of the position in which the plurality of devices under test 22 are mounted in the parallel direction, by moving the mirror and the image capturing camera in a direction substantially the same as the image capturing direction. Here, an example of the parallel direction of the mounting surface of the test tray 20 is the row direction of the mounting surface.

In this case, the device image capturing section 216 may move the image capturing camera and the mirror in a direction that is substantially vertical to the image capturing direction of the image capturing camera and that is substantially parallel to the mounting surface of the test tray 20. By doing so, the device-image capturing section 216 can capture the image of the position in which the plurality of devices under test 22 arranged in the column direction of the mounting surface of the test tray 20. In this case, the image capturing camera may be mounted on the position adjusting section 218.

As explained above, the device image capturing section 216 may include the image capturing camera, the mirror, and the movable section to capture the image of the position in which a plurality of devices under test 22 are mounted in row and column directions on the mounting surface of the test tray 20. Instead, the device image capturing section 216 may orient the image capturing direction of the image capturing camera or the like towards the mounting surface of the test tray 20, and captures the mounting position of the plurality of devices under test 22 by moving the image capturing camera in the row and column directions of the mounting surface. In this case, the image capturing camera may be mounted on the position adjusting section 218.

The position arranging section 218 moves each device under test 22 on the test tray 20, to adjust the position of it to the respective socket. The position adjusting section 218 adjusts the position of each device under test 22 within the heating section 210. The position adjusting section 218 may adjust the positions respectively of the plurality of devices under test 22 having been controlled to the test temperature in the heating section 210. There may be a plurality of position adjusting sections 218 provided in the heating section 210, and each may adjust a corresponding one of the plurality of devices under test 22.

The test section 220 is a space in which the plurality of devices under test 22 are tested, to which the test tray 20 is conveyed from the heating section 210. The test section 220 is connected to a test apparatus, and a socket board 120 mounted to the test head 110 of the test apparatus is provided in the chamber. Within the test section 220, the test tray 20 is conveyed to the socket board 120, and the plurality of the devices under test 22 are electrically connected to the respective sockets. The test section 220 includes a device mounting section 222, a driving section 226, and a socket image capturing section 228.

The device mounting section 222 mounts the plurality of devices under test 22 whose position has been adjusted by the position adjusting section 218, to the plurality of sockets of the socket board 120. The device mounting section 222 includes a plurality of press sections 224. There are a plurality of press sections 224 provided to correspond in number to the plurality of devices under test 22. A press section 224 presses the surface opposite to the electrode surface or the terminal surface connected to a socket of each device under test 22 towards the socket board 120, thereby mounting the device under test 22 to the corresponding socket.

The device mounting section 222 controls the temperature of the plurality of devices under test 22 on the test tray 20. The device mounting section 222 controls the temperature of the plurality of devices under test 22 as described in the temperature condition for the test performed by the test apparatus. In the device mounting section 222, the plurality of press sections 224 may control the temperature of the plurality of devices under test 22. Here, the plurality of press sections 224 may control the temperature of the devices under test 22 separately one another, or collectively for two or more press sections 224.

The press section 224 may individually heat or cool each device under test 22 from the surface thereof that is opposite to the electrode surface or the terminal surface thereof. Instead, the press section 224 may include a thermoelectric device such as a Peltier device, or instead either a cooler or a heater for circulating a cooling medium or a heating medium. Because the press section 224 directly controls the temperature of the devices under test 22 independently from each other and that from their rear side, the temperature of the plurality of devices under test 22 can be controlled quickly and with low power consumption, without necessitating that the test section 220 control the temperature of the entire chamber accurately.

The driving section 226 drives the device mounting section 222. The driving section 226 controls the movement of the device mounting section 222, conveys the test tray 20 to the socket board 120, and electrically connects the plurality of devices under test 22 to the sockets respectively. In addition, the driving section 226 may drive heating or cooling of the press section 224.

The socket image capturing section 228 captures the image of the mounting position of the plurality of sockets of the socket board 120. The socket image capturing section 228 may capture the image of the mounting position of each socket, or the mounting position for each two or more sockets. The socket image capturing section 228 may include a movable section to capture the plurality of sockets.

For example, the socket image capturing section 228 includes an image capturing camera or the like, and orients the image capturing direction of the image capturing camera parallel to the surface of the socket board 120 that mounts the socket, and captures the image of the socket on the mounting surface via the mirror mounted on the movable section. The mirror may have an angle of about 45 degrees with respect to the mounting surface of the socket board 120, so as to reflect the image of the socket onto the image capturing camera.

The image capturing section 228 moves the mirror in the parallel direction of the mounting surface of the socket board 120 which corresponds to the image capturing direction of the image capturing camera, thereby capturing the mounting position of the plurality of sockets mounted in the parallel direction. Here, the row direction of the mounting surface is set as the parallel direction of the mounting surface of the socket board 120, for example. In this case, the image capturing camera and the mirror may be moved by the socket image capturing section 228 in a direction that is substantially vertical to the image capturing direction of the image capturing camera and that is substantially parallel to the mounting surface of the socket board 120. By doing so, the socket image capturing section 228 can capture the image of the position in which the plurality of sockets are arranged in the column direction of the mounting surface of the socket board 120.

The socket image capturing section 228 may capture the image of the position in which a plurality of sockets are mounted in row and column directions on the mounting surface of the socket board 120 by including the image capturing camera, the mirror, and the movable section, in the above-stated manner. Instead, the socket image capturing section 228 may orient the image capturing direction of the image capturing camera or the like towards the mounting surface of the socket board 120, and capture the mounting position of the plurality of sockets by moving the image capturing camera in the row and column directions of the mounting surface.

The heat removing section 230 is a space into which the test tray 20 is conveyed from the test section 220, and the conveyed test tray 20 is conveyed outside the heat removing section 230. The heat removing section 230 includes an unloader, and this unloader is used to unload, to outside the heat removing section 230, the test tray 20 on which the plurality of devices under test 22 after having undergone a test are mounted. The heat removing section 230 includes a temperature controller 280.

The temperature controller 280 controls the temperature of the loaded test tray 20 in the heat removing section 230. The temperature controller 280 heats or cools the plurality of devices under test 22 that are fresh out of the test section 220 and so are at around the test temperature, to a pre-set temperature range that is about room temperatures. The temperature controller 280 may be a thermoelectric device such as a Peltier device, or instead either a heater or a cooler for circulating a cooling medium or a heating medium.

The conveyer 240 conveys the test tray 20 either from the heating section 210 to the test section 220, or from the test section 220 to the heat removing section 230. The conveyer 240 may receive the test tray 20 conveyed by the loader of the heating section 210. The conveyer 240 may also passes the test tray 20 to the unloader of the heat removing section 230.

The second mounting apparatus 250 mounts the plurality of devices under test 22 to from the test tray 20 to the user tray 10. The second mounting apparatus 250 may have an arm for adsorbing the devices under test 22. The second mounting apparatus 250 may move the devices under test 22 from the test tray 20 to the user tray 10, by firmly adsorbing it.

The detecting section 260 detects the position of each device under test 22 on the test tray 20 as well as the position of each socket of the socket board 120, from the images captured by the device image capturing section 216 and the socket image capturing section 228. The detecting section 260 compares the position of each device under test 22 on the test tray 20 to the position of the socket to which the device under test 22 is connected, thereby detecting the device under test 22 whose position with respect to the socket needs adjustment.

The detecting section 260 detects the moving direction and the moving amount, which correspond to the adjusting amount of the device under test 22 to be adjusted. Examples of the adjustment amount detected by the detecting section 260 include an XY direction of the device under test 22 on the test tray and the moving amount in each direction, and the rotation direction of it on the test tray and the rotation angle θ. The detecting section 260 transmits the detection result to the controller 270.

The controller 270 receives the detection result from the detecting section 260, and designates to the position adjusting section 218 the device(s) under test 22 to be adjusted and the necessary amount of adjustment based on the detection result, thereby adjusting the position of the device(s) under test 22. In addition, the controller 270 is connected to the first mounting apparatus 200, the conveyer 240, the driving section 226, the second mounting apparatus 250, the loader, and the unloader, and controls the mounting of the plurality of devices under test 22, the loading/unloading of the test tray 20, the driving of the device mounting section 222, and the conveyance of the test tray 20.

In addition, the controller 270 may be connected to the temperature controller 212, the device mounting section 222, and the temperature controller 280, to control the temperature of the plurality of devices under test 22. After mounting of the plurality of devices under test 22 to the corresponding sockets, the controller 270 may also notify the test apparatus of the completion of mounting the plurality of devices under test 22.

Figure 2:
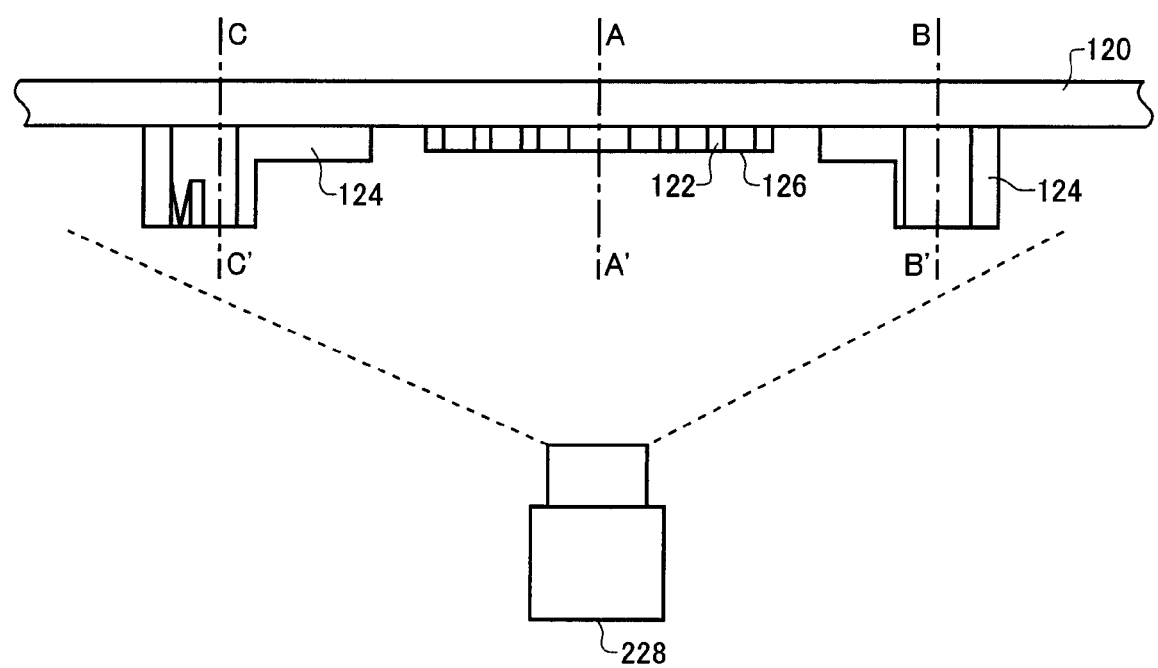
FIG. 2 shows an exemplary configuration of a socket board 120 of the test head 110 according to the present embodiment, together with a socket image capturing section 228.

FIG. 2 shows an exemplary configuration of a socket board 120 of the test head 110 according to the present embodiment, together with a socket image capturing section 228. This drawing shows the overall configuration of the socket board 120 in cross section. The socket board 120 includes a socket 122 and a reference pin inserting section 124.

The socket 122 is electrically connected to a device under test 22, and conveys a test signal supplied from a test apparatus to the device under test 22, as well as conveying a response signal in response to the test signal, to the test apparatus. There are a plurality of sockets 122 provided on the socket board 120 on a surface opposite to the test head 110 of the socket board 120 in both row and column directions. The socket 122 includes a plurality of electrodes 126 electrically connectable to an electrode, a terminal, or the like of the device under test 22.

The reference pin inserting section 124 is provided on a surface on which the socket 122 of the socket board 120 is mounted, and receives a reference pin of the test tray 20. One socket 122 may be provided with two or more reference pin inserting sections 124. Preferably, there may be four reference pin inserting sections 124 respectively in the vicinity of the four corners of the socket 122.

The socket image capturing section 228 captures the image of each socket 122 together with the corresponding reference pin inserting section 124. The socket image capturing section 228 captures the image of the socket 122 and the corresponding reference pin inserting section 124, as the mounting position of the socket 122. The detecting section 260 extracts, from the captured image, the central position of the socket 122 shown by the line A-A' in the drawing as well as the central position of the reference pin to be inserted to the reference pin inserting section 124 shown by the line B-B' and the line C-C'. In other words, the detecting section 260 detects the relative position between the central position of the socket 122 and the central position of the reference pin, as the mounting position of the socket 122.

Figure 3:
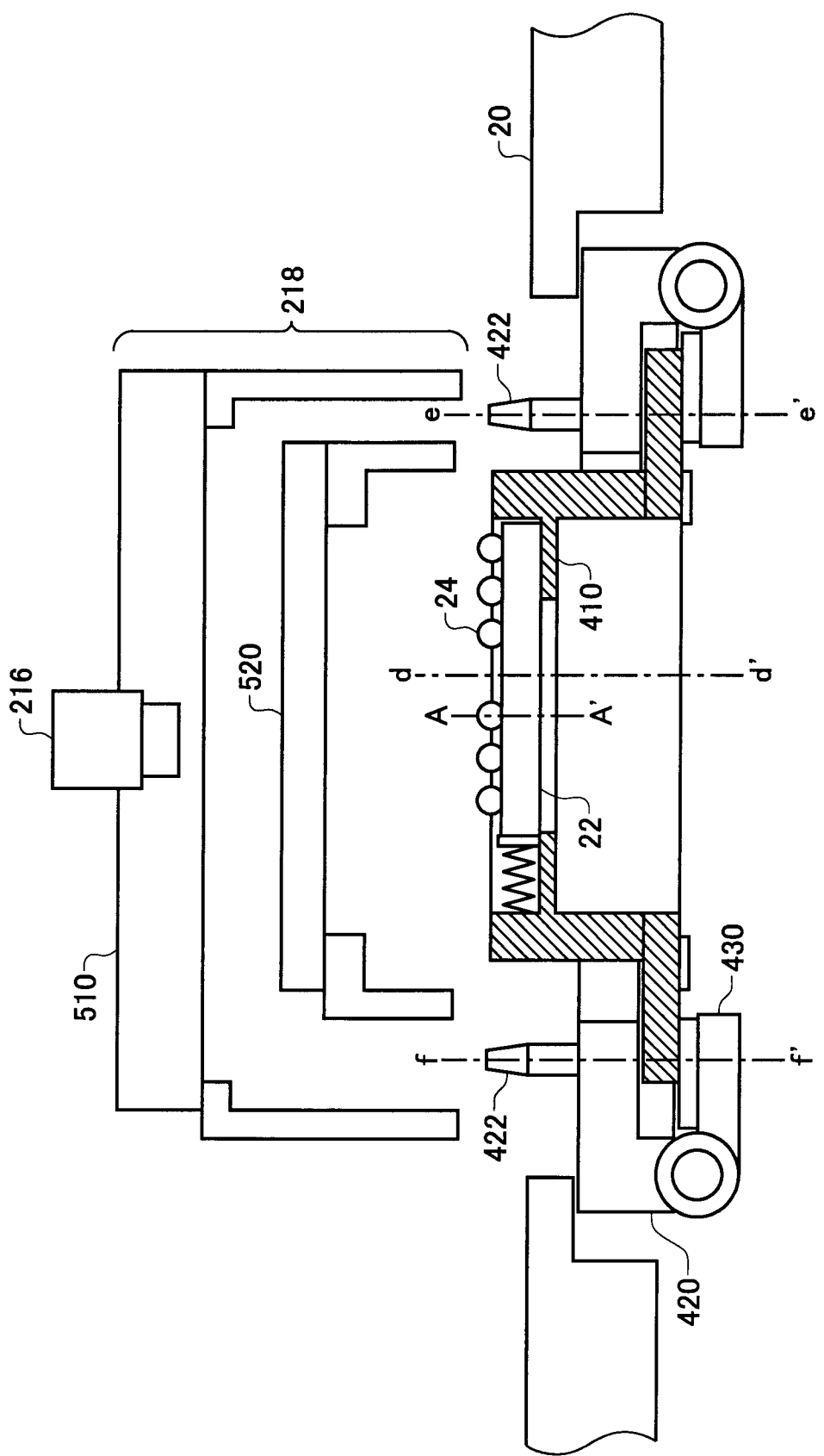
FIG. 3 shows an exemplary configuration of a position adjustment section 218 according to the present embodiment, together with the test tray 20.

FIG. 3 schematically shows the cross section of an exemplary configuration of a position adjustment section 218 according to the present embodiment, together with the test tray 20. The position adjusting section 218 circulates each of two or more of devices under tests 22, and adjusts the position of the device under test 22 to the socket 122. The position adjusting section 218 may include a movable section, which circulates on the test tray 20. Here, the test tray 20 includes an inner unit 410, an outer unit 420, and a reference pin 422, corresponding to each of the plurality of devices under test 22. In addition, the position adjusting section 218 includes a fixing section 510 and an actuator 520.

The inner unit 410 mounts thereon each of the plurality of devices under test 22. The inner unit 410 mounts the device under test 22 so that its center positions as predetermined. For example, the inner unit 410 adjusts the center of the device under test 22 to the position shown by the line d-d' in the drawing. The inner unit 410 may include a spring to apply a force to the mounting surface of the test tray 20 in the parallel direction thereto, thereby fixing the device under test 22. The inner unit 410 is provided with a penetration hole, through which a part of the surface of the device under test 22 towards the temperature controller 212 is exposed.

The outer unit 420 includes a lock mechanism that is fixed to the test tray 20, the lock mechanism switching whether to lock the inner unit 410 or to retain the inner unit 410 to be movable. The outer unit 420 includes a release section 430 as the lock mechanism. The release section 430 may release the lock of the inner unit 410, according to an instruction from the controller 270 or the lock release operation performed by the position adjusting section 218. The outer unit 420 may be provided with a penetration hole, through which a part of the inner unit 410 towards the temperature controller 212 is exposed.

A plurality of reference pins 422 are provided on predetermined positions on the mounting surface of the test tray 20, and are inserted to the plurality of reference pin inserting sections 124 of the socket board 120. The drawing shows an example of the reference pins 422 whose centers are respectively adjusted to the line e-e' and the line f-f' on the test tray 20. The drawing also shows an example of the plurality of reference pins 422 mounted to the outer unit 420. The line A-A' of the drawing is an example of the central position of the socket 122 detected by the detecting section 260 explained above with reference to FIG. 2.

The fixing section 510 is fixed to the plurality of reference pins 422 provided on the test tray 20. The fixing section 510 includes a guide, a groove, a rail, or the like corresponding in shape of the reference pin 422, so as to be fixed to the reference pin 422. Instead, the fixing section 510 may include a reference pin inserting section to which the reference pin 422 is inserted and fixed.

The actuator 520 adjusts the position of the devices under test 22 to the sockets 122. For example, the actuator 520 moves the inner unit 410 relative to the outer unit 420, after release of the lock of the inner unit 410. The drawing shows an example in which a set of a fixing section 510 and an actuator 520 are provided for a single device under test 22, for adjusting the position of the device under test 22.

Alternatively, it is possible to provide a plurality of actuators 520 for a single fixing section 510, for the purpose of adjusting the position of the plurality of devices under test 22. In this case, the plurality of actuators 520 may be arranged in the row direction according to the position of the plurality of devices under test 22 provided in the row direction of the test tray 20. Here, each of the plurality of actuators 520 arranged in the row direction sequentially adjusts the positions of two or more devices under test 22 arranged in the column direction.

Still alternatively, it is possible to provide the plurality of actuators 520 in the column direction according to the position of the plurality of devices under test 22 arranged in the column direction of the test tray 20. In this case, each of the plurality of actuators 520 arranged in the column direction sequentially adjusts the positions of two or more devices under test 22 arranged in the row direction.

As explained so far, when there are a plurality of actuators 520 in the heating section 210, the lock mechanism may release the inner unit 410 for each of the devices under test 22, and may lock the outer unit 420 after the relative movement of the inner unit 410 to the outer unit 420 by each of the plurality of actuators 520. By doing so, the position adjusting section 218 may adjust the position of the devices under test 22 on the test tray 20 one by one, using the plurality of actuators 520.

Here, the device image capturing section 216 captures the image of the inner unit 410 and the outer unit 420 for each of the plurality of devices under test 22. The device image capturing section 216 captures the image of a device under test 22 and the corresponding reference pin 422, as the mounting position of the device under test 22.

The detecting section 260 detects the relative position between the inner unit 410 and the outer unit 420, from the image of the image captured by the image capturing section. For example, the detecting section 260 extracts the central position of the device under test 22 shown by the line d-d' in the drawing as well as the central position of the reference pin 422 shown by the line e-e' and the line f-f' in the drawing, thereby detecting the relative position of it from the reference pin 422 of the device under test 22.

Figure 4:
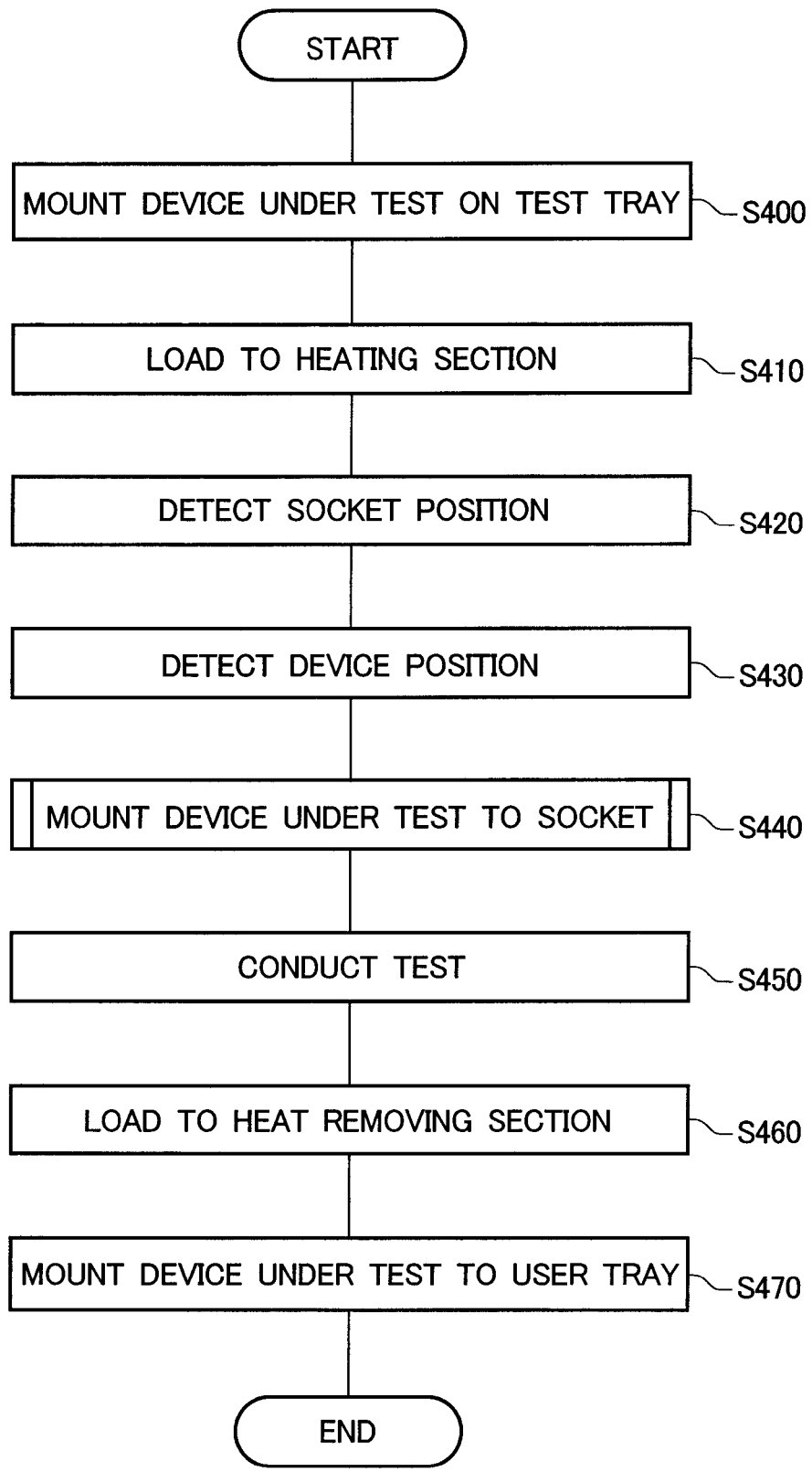
FIG. 4 shows an operational flow of the handler apparatus 100 according to the present embodiment and a test apparatus.

FIG. 4 shows an operational flow of the handler apparatus 100 according to the present embodiment and a test apparatus. First, the handler apparatus 100 mounts device under tests 22 on the test tray 20 (S400). The first mounting apparatus 200 mounts a plurality of devices under test 22 onto the inner unit 410 of the test tray 20 from the user tray 10.

Next, the loader of the heating section 210 loads the test tray 20 to the heating section 210 (S410). In the heating section 210, the temperature controller 212 receives the test tray 20 from the loader, and the temperature control unit 214 controls the temperature of the plurality of devices under test 22 on the test tray 20 to be substantially the same temperature as prescribed in the temperature condition for the test performed by the test apparatus.

When the inner unit 410 and the outer unit 420 of the temperature control unit 214 have a penetration hole, the corresponding device under test 22 can be brought to direct contact with the temperature control unit 214, to be directly heated or cooled. When the inner unit 410 of the temperature control unit 214 is not provided with any penetration hole, the temperature control unit 214 may conduct heating or cooling by contacting to a part of the inner unit 410 near the corresponding device under test 22.

Next, the socket image capturing section 228 captures the image of the mounting position of the plurality of sockets 122 of the socket board 120, and the detecting section 260 detects the mounting position of each socket 122 based on the image taken by the socket image capturing section 228 (S420). Here, the socket image capturing section 228 and the detecting section 260 may pursue position detecting of the socket 122 while the temperature control unit 214 is controlling the temperature of the device under test 22.

Alternatively, the socket image capturing section 228 and the detecting section 260 may detect the position of the socket 122, prior to the temperature control of the temperature control unit 214. For example, the socket image capturing section 228 and the detecting section 260 may detect the position of the socket 122 prior to the start of the test. Instead, the socket image capturing section 228 and the detecting section 260 may detect the position of the socket 122 after the temperature in the test section 220 has been controlled to the temperature substantially equal to the test temperature.

Next, the device image capturing section 216 captures the image of the inner unit 410 and the outer unit 420 for each device under test 22, and the detecting section 260 detects the relative position between the central position of the device under test 22 and the reference pin 422, from the captured image (S430). Here, the detecting section 260 may detect whether to adjust the position of the device under test 22 on the test tray 20 by comparing the relative position of the device under test 22 with the mounting position of the corresponding socket 122. For example, the detecting section 260 may determine to adjust the device under test 22, if the difference between the relative position of the device under test 22 and the mounting position of the socket 122 is outside a pre-set range.

The device image capturing section 216 and the detecting section 260 may detect the position of the device under test 22, after completion of the temperature control of the device under test 22 conducted by the temperature control unit 214. The device image capturing section 216 and the detecting section 260 may alternatively detect the position of the device under test 22 while the temperature control unit 214 is controlling the temperature of the device under test 22.

Next, the handler apparatus 100 mounts the plurality of devices under test 22 to the corresponding sockets 122 (S440). Note that the flow through which the plurality of devices under test 22 are mounted to the corresponding sockets 122 is detailed with reference to FIG. 5.

Subsequently, the test apparatus tests the plurality of devices under test 22 (S450). The test apparatus may perform the test to the plurality of devices under test 22 at the same time.

Next, the handler apparatus 100 loads the test tray 20 form the test section 220 to the heat removing section (S460). Here, the driving section 226 drives the device mounting section 222 to move the test tray 20, and either mounts or removes the plurality of devices under test 22 to or from the corresponding sockets 122.

In addition, the driving section 226 drives the device mounting section 222 to pass the test tray 20 to the conveyer 240. The conveyer 240 conveys the received test tray 20 from the test section 220 to the heat removing section 230. The temperature controller 280 controls the plurality of devices under test 22 within a pre-set temperature range in the heating section 230.

Next, the second mounting apparatus 250 mounts the plurality of devices under test 22 to the user tray 10 (S470). By performing the operational flow described so far, the handler apparatus 100 can mount the plurality of devices under test 22 mounted on the user tray 10 to the corresponding sockets 122, and after the test by the test apparatus, mounts the plurality of devices under test 22 back to the user tray 10 again.

Figure 5:
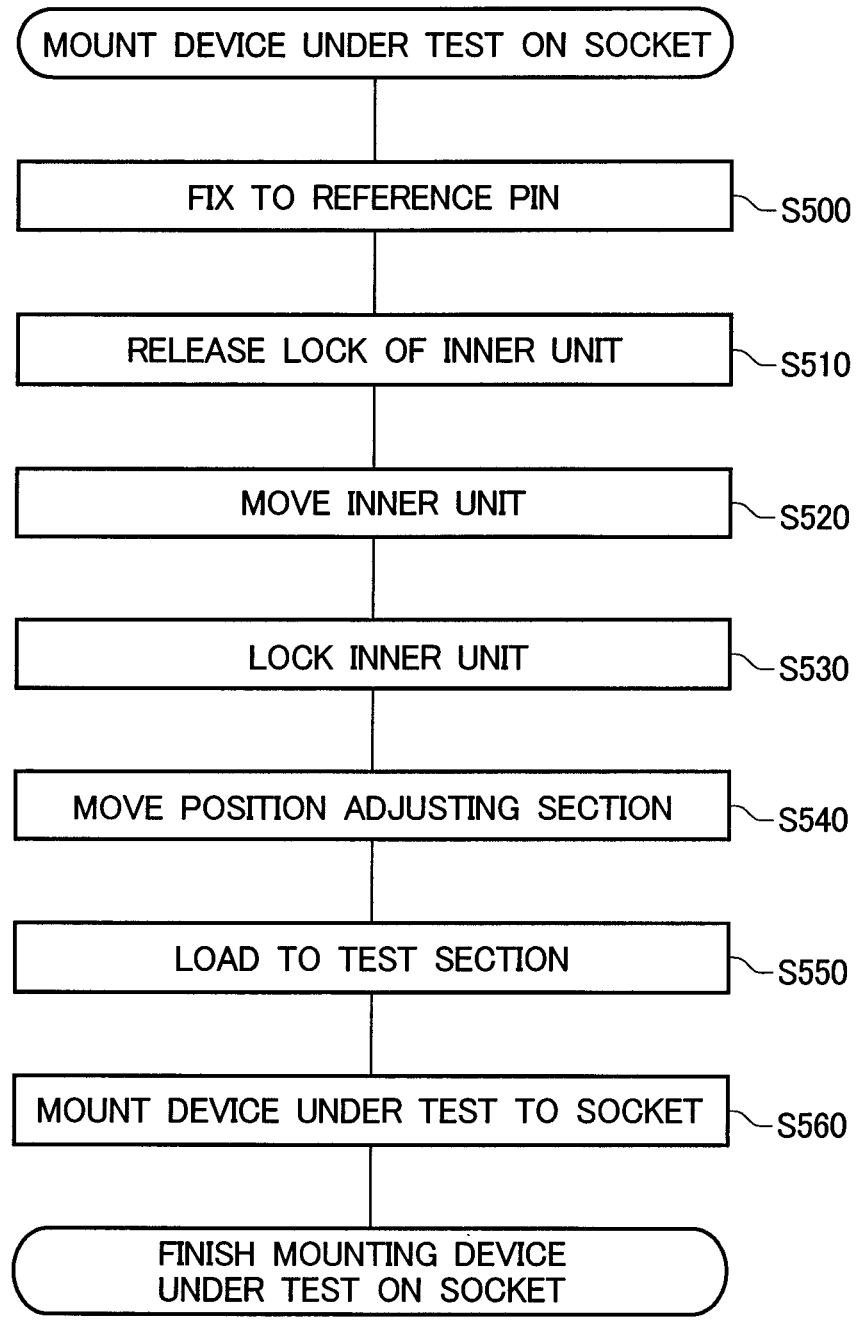
FIG. 5 shows an operational flow of the handler apparatus 100 according to the present embodiment mounting a device under test to a socket.

FIG. 5 shows an operational flow of the handler apparatus 100 according to the present embodiment mounting a device under test to a socket. FIG. 6-FIG. 11 respectively show an exemplary configuration of the handler apparatus 100 in each step of the operational flow.

Figure 6:
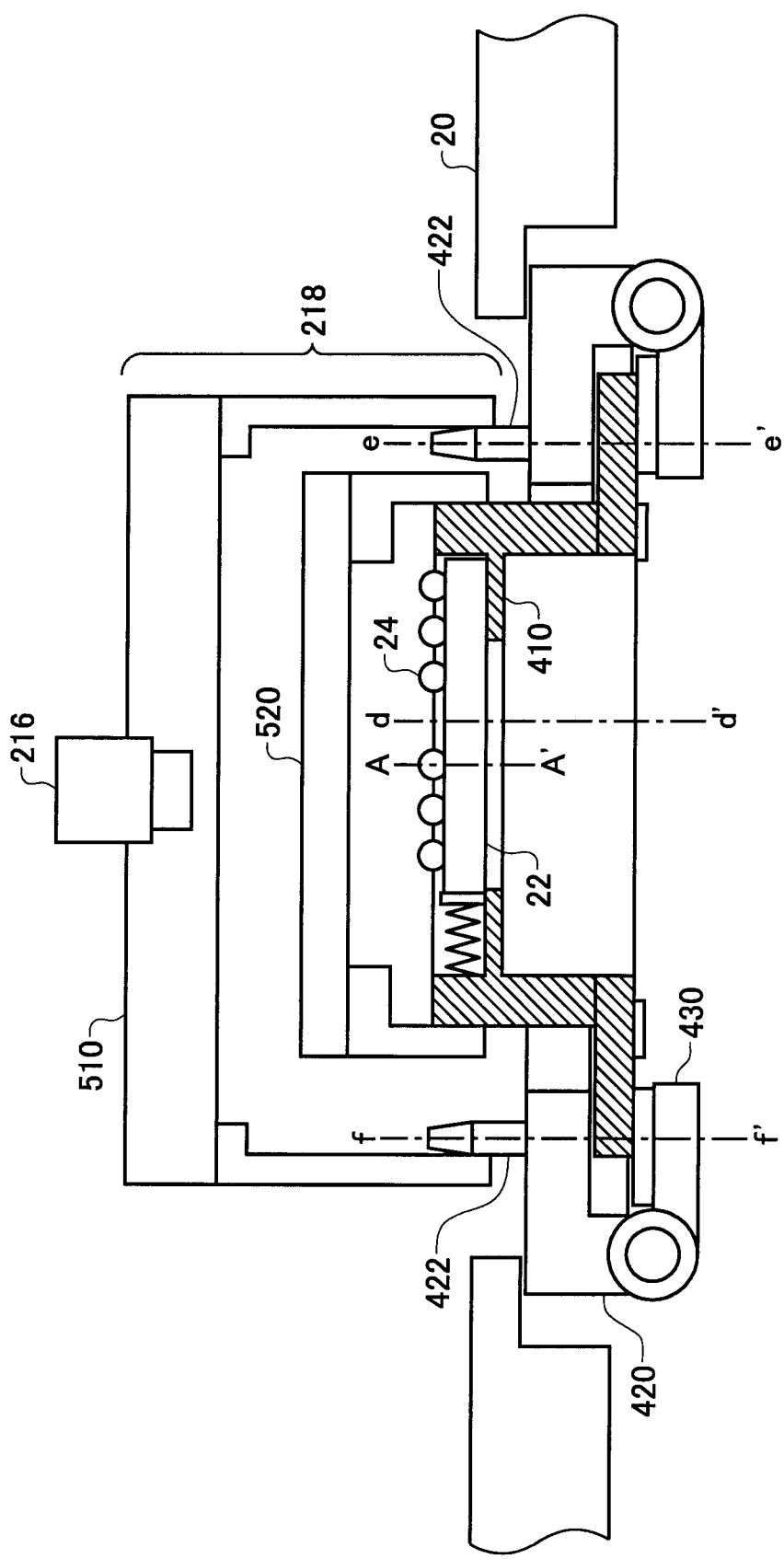
FIG. 6 shows an exemplary configuration of a fixing section 510 according to the present embodiment fixed to a reference pin 422 of the test tray 20.

First, the fixing section 510 of the position adjusting section 218 is fixed to the plurality of reference pins 422 provided for the test tray 20 (S500). Here, the controller 270 may be connected to the movable section of the position adjusting section 218, move the position adjusting section 218, and fix the fixing section 510 to the reference pin 422. FIG. 6 shows an exemplary configuration of a fixing section 510 according to the present embodiment fixed to a reference pin 422 of the test tray 20. The line A-A' in the drawing is an example of the central position of the socket 122 detected by the detecting section 260, explained above with reference to FIG. 2 and FIG. 3.

Next, the handler apparatus 100 releases the lock of the inner unit 410 (S510). Here, the heating section 210 may include an operating section for operating the lock mechanism in accordance with an instruction to release the lock of the controller 270. The operating section may move the release section 430 by being in contact with the release section 430 in accordance with the instruction of the controller 270, thereby releasing the lock.

Figure 7:
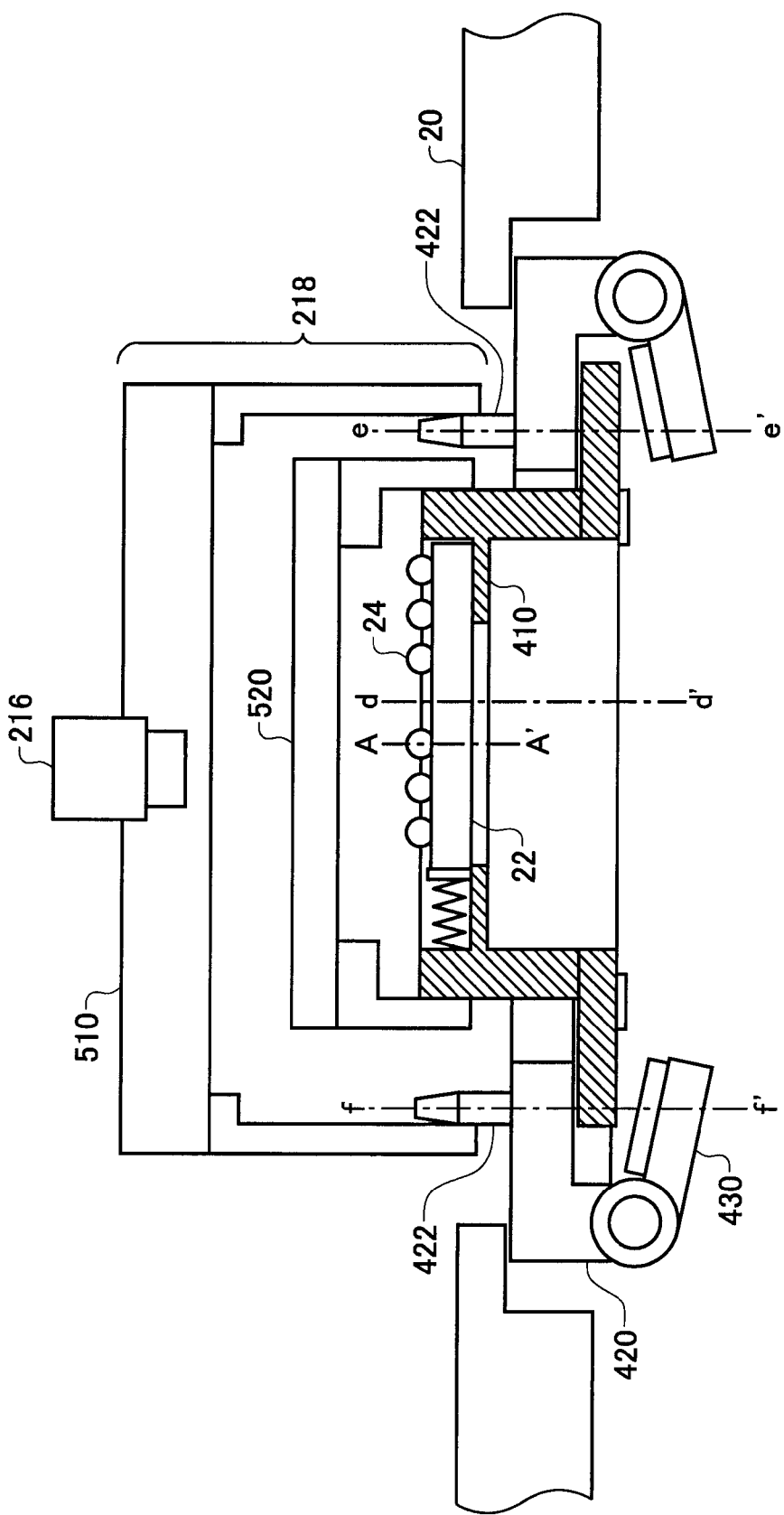
FIG. 7 shows a state in which the test tray 20 of the present embodiment has released the lock of an inner unit 410 of the test tray 20.

Instead, the test tray 20 may include an operating section to receive, via the temperature controller 212, a signal to release the lock sent from the controller 270, and release the lock of the release section 430. FIG. 7 shows a state in which the test tray 20 of the present embodiment has released the lock of an inner unit 410 of the test tray 20.

Next, the actuator 520 moves the inner unit 410 relative to the outer unit 420 (S520). The actuator 520 adjusts the position of the inner unit 410 relative to the outer unit 420, based on the relative position detected by the detecting section 260. Accordingly, the position adjusting section 218 can adjust the position of the device under test 22 on the test tray 20. For example, the detecting section 260 may detect the direction and the distance in which the inner unit 410 should be moved, from the difference between the relative position between the central position of the reference pin 422 and the central position of the socket 122, and the relative position between the reference pin 422 and the device under test 22.

In other words, the detecting section 260 may detect the direction and the distance in which the inner unit 410 should be moved, which would result in the difference between the relative position between the central position of the reference pin 422 and the central position of the socket 122 of θ or within a pre-set range, and the relative position between the reference pin 422 and the device under test 22. Here, the detecting section 260 may set the pre-set range to be about the moving error range of the actuator 520.

Figure 8:
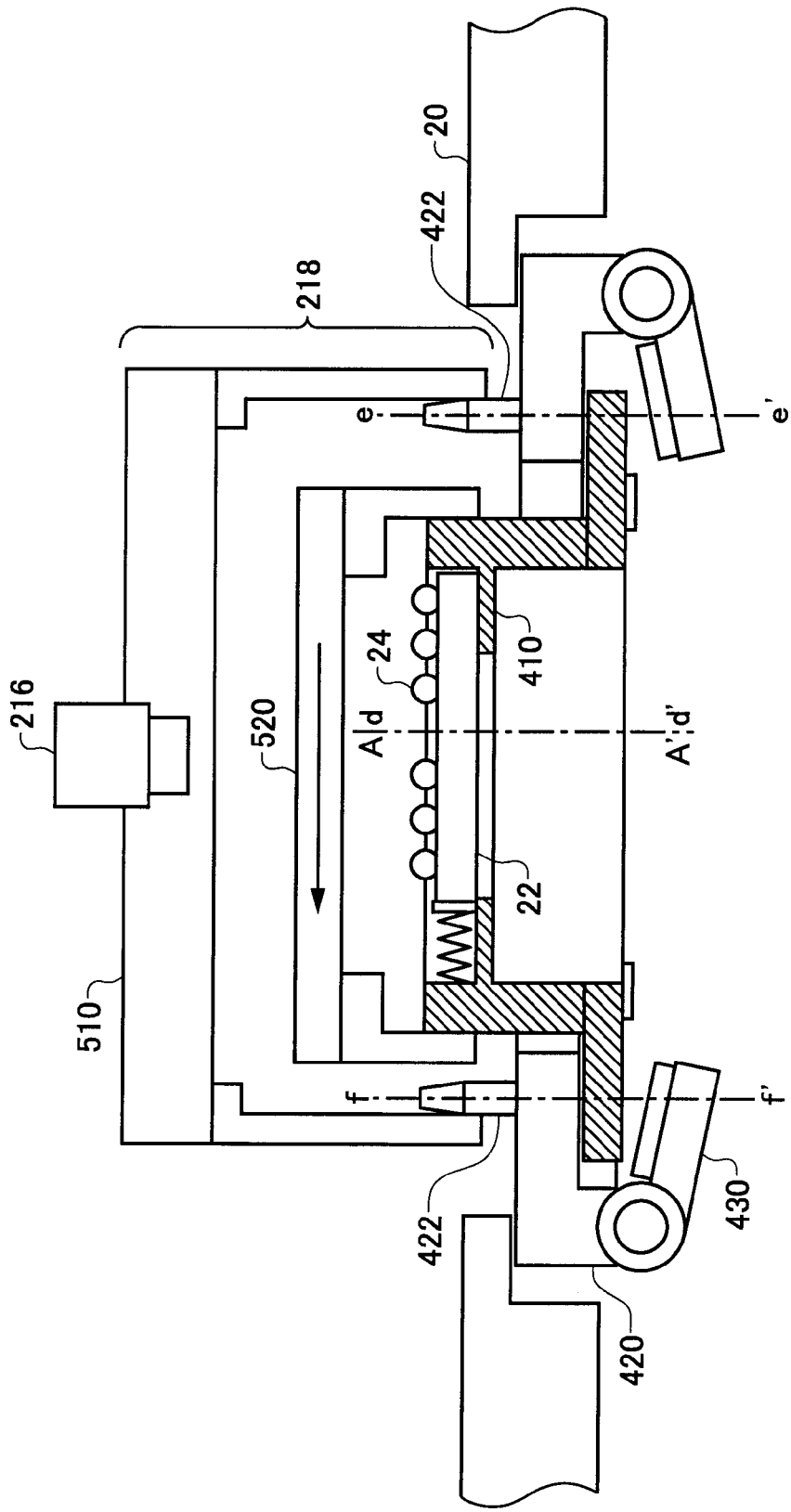
FIG. 8 shows a state in which an actuator 520 according to the present embodiment has moved the inner unit 410.

The actuator 520 moves the inner unit 410 according to the direction and the distance detected by the detecting section 260. FIG. 8 shows a state in which an actuator 520 according to the present embodiment has moved the inner unit 410. In the drawing, the actuator 520 moves the inner unit 410 in the direction of the arrow in the drawing, thereby matching the line A-A' corresponding to the central position of the socket 122 to the line d-d' corresponding to the central position of the device under test 22.

Next, the handler apparatus 100 locks the inner unit 410 (S530). Here, when the heating section 210 has an operating section, the operating section may contact the release section 430 and move it, according to an instruction from the controller 270. Instead, the test tray 20 may lock the release section 430 by receiving a signal to lock, from the controller 270 via the temperature controller 212.

Next, the position adjusting section 218 moves by releasing the fixing of the reference pin 422 of the test tray 20 (S540). The position adjusting section 218 may move towards the device under test 22 to be adjusted next. The handler 100 performs detection of the relative position and adjustment of the position to each of the plurality of devices under test 22.

Figure 9:
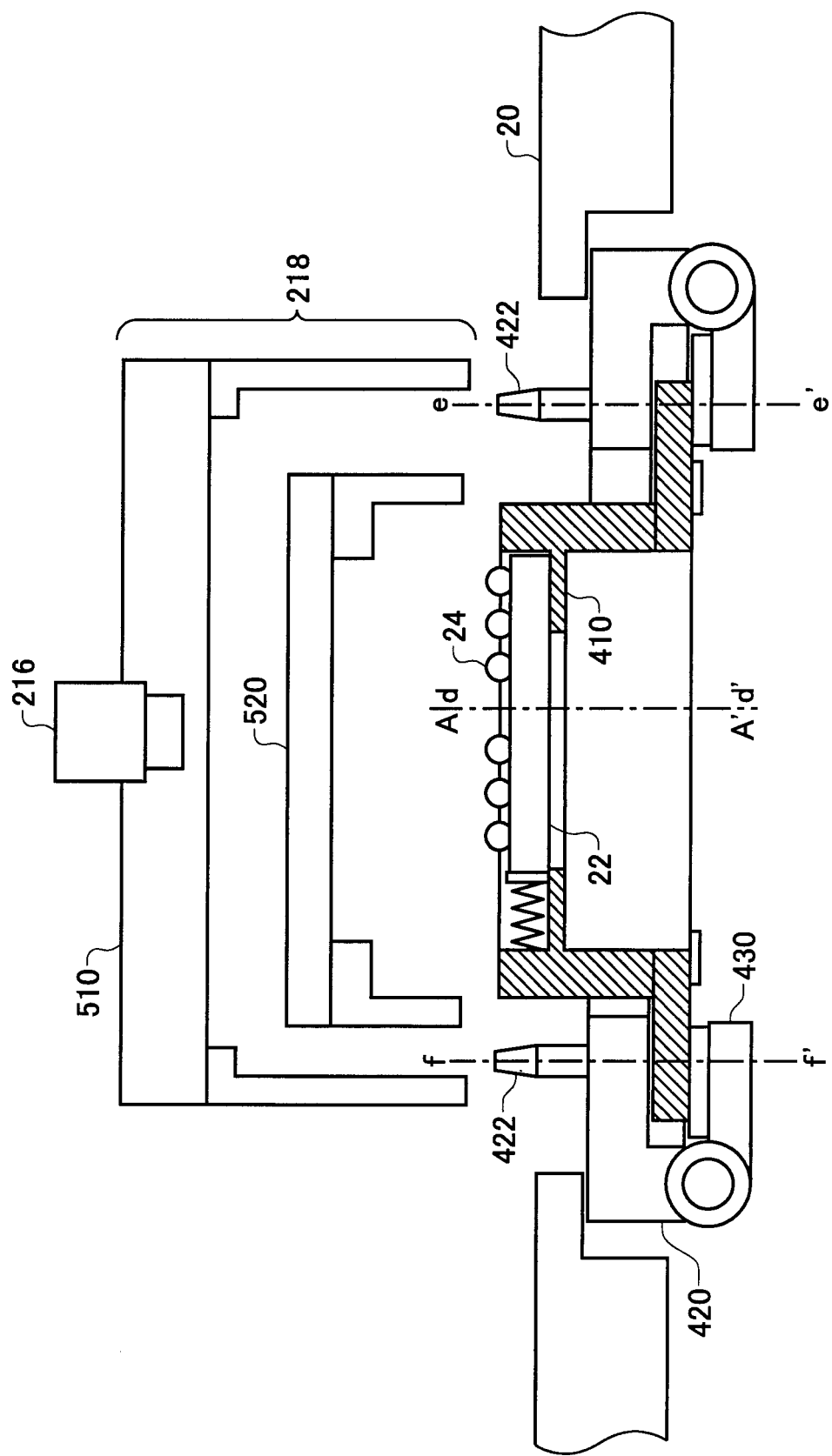
FIG. 9 shows a state in which a position adjusting section 218 according to the present embodiment has finished moving the inner unit 410, locked the inner unit 410, and removed it from the test tray 20.

The handler apparatus 100 may perform the detection of the relative position and the adjustment of the position for each device under test 22. Alternatively, the handler apparatus 100 may perform the detection of the relative position on the plurality of devices under test 22 first, and then adjust the positions thereof. FIG. 9 shows a state in which a position adjusting section 218 according to the present embodiment has finished moving the inner unit 410, locked the inner unit 410, and removed it from the test tray 20.

The handler apparatus 100 conveys the test tray 20 to the test section 220, after finishing adjusting the plurality of devices under test 22 whose positions are required to be adjusted on the test tray 20 (S550). Here, the temperature controller 212 passes the test tray 20 to the conveyer 240, and the conveyer 240 conveys the received test tray 20 to the test section 220. The conveyer 240 passes the test tray 20 to the device mounting section 222 in the test section 220.

Figure 10:
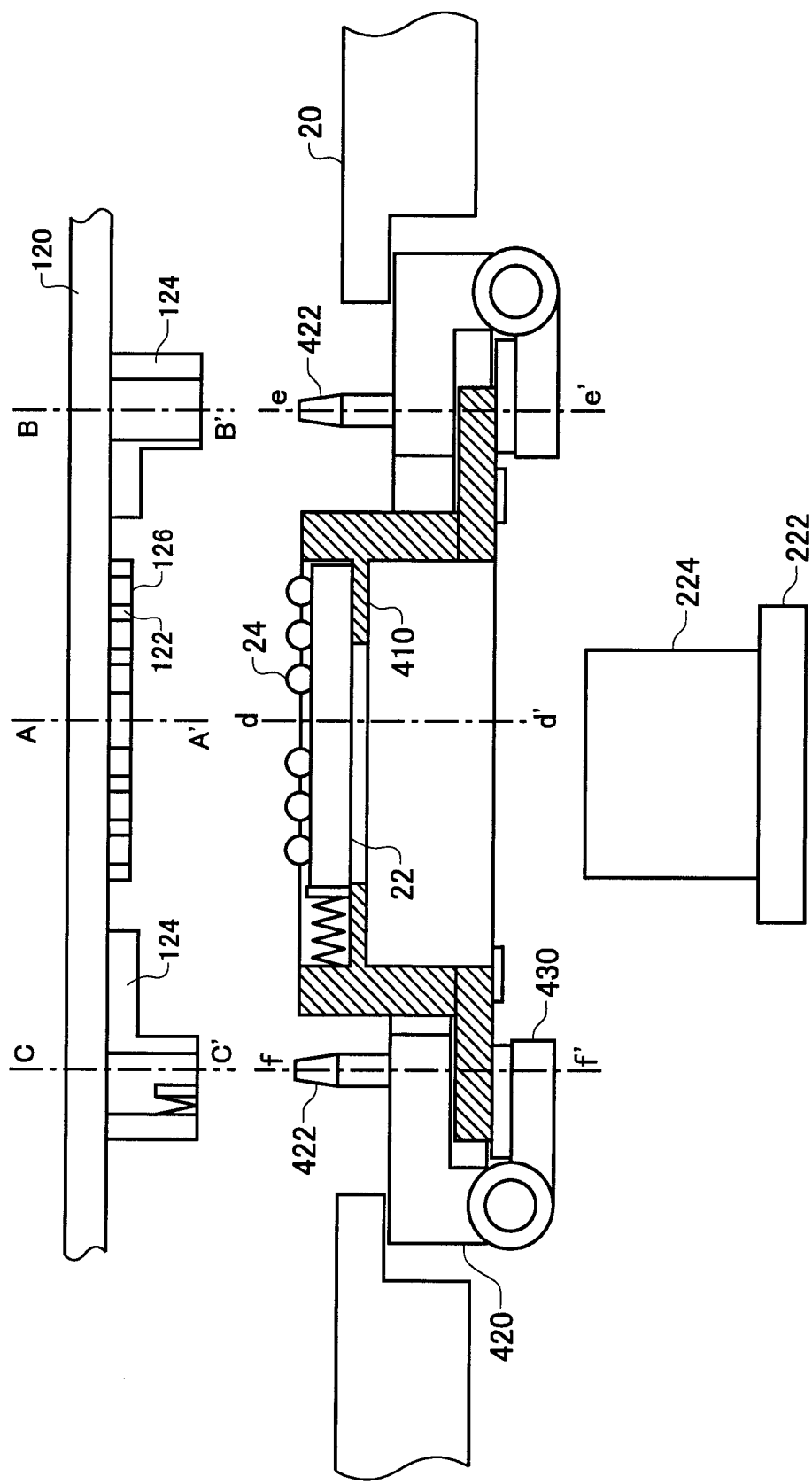
FIG. 10 shows a state in which a conveyer 240 according to the present embodiment has loaded the test tray 20 to a test section 220.

FIG. 10 shows a state in which a conveyer 240 according to the present embodiment has loaded the test tray 20 to a test section 220. The device mounting section 222 uses the press sections 224 to press the surface opposite to the electrode surface or the terminal surface through which each device under test 22 is connected to the socket 122.

When the inner unit 410 and the outer unit 420 have a penetration hole, the press section 224 can be brought to direct contact with the corresponding device under test 22, to perform heating or cooling. When the inner unit 410 is not provided with any penetration hole, the press section 224 may conduct heating or cooling by contacting to a part of the inner unit 410 near the corresponding device under test 22.

Next, the device mounting section 222 mounts the device under test 22 to the socket 122 (S560). When the inner unit 410 and the outer unit 420 have a penetration hole, the press section 224 may be brought into direct contact with the corresponding device under test 22 and press the device under test 22. When there is no penetration hole provided through the inner unit 410, the press section 224 may press a part of the inner unit 410 adjacent to the corresponding device under test 22.

Figure 11:
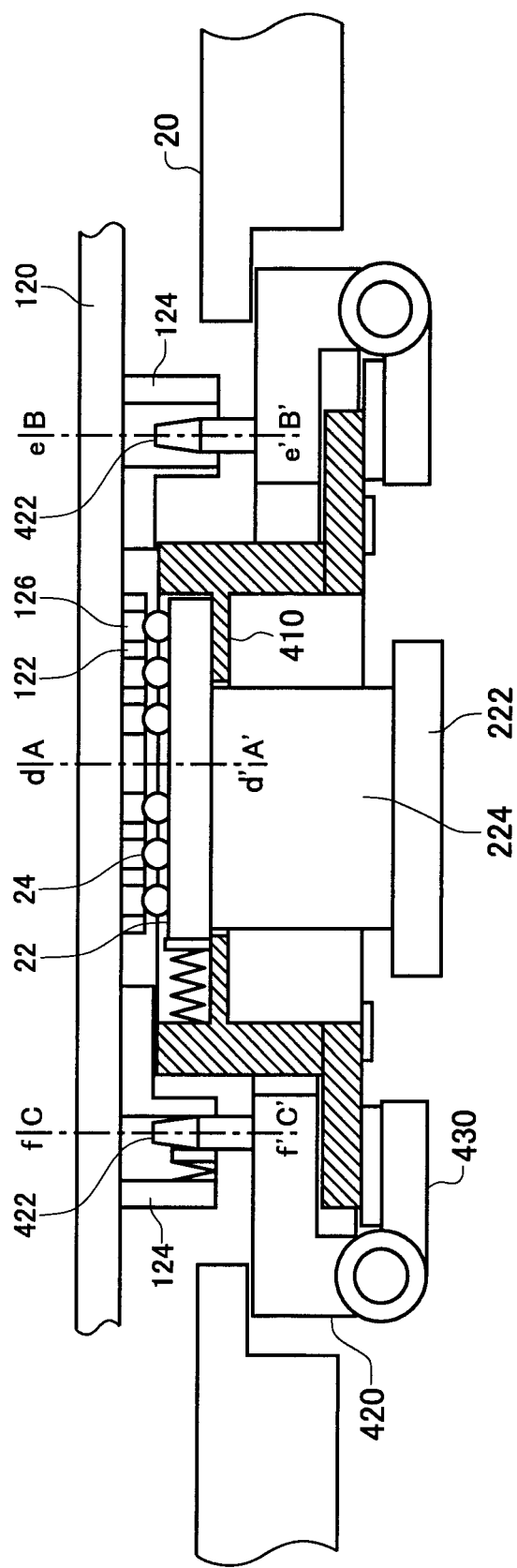
FIG. 11 shows a state in which a device mounting section 222 according to the present embodiment has mounted the device under test 22 to a socket 122.

Here, the position adjusting section 218 matches the central positions of the socket 122 and the device under test 22 by referring to the reference pin 422. Therefore, when the press section 224 presses the device under test 22 to insert the reference pin 422 into the reference pin inserting section 124, the device under test 22 is mounted to the socket 122. In this way, the plurality of electrodes 24 of the device under test 22 are brought into electrical connection with the plurality of electrodes 126 of the corresponding sockets 122. FIG. 11 shows a state in which a device mounting section 222 according to the present embodiment has mounted the device under test 22 to a socket 122.

According to the above-explained operational flow, the position of the plurality of devices under test 22 with respect to the corresponding sockets 122 on the test tray 20 are adjusted by the handler apparatus 100, thereby mounting the plurality of devices under test 22 to the corresponding sockets 122. This enables a test apparatus to conduct a test on the plurality of devices under test 22. The handler apparatus 100 may automatically perform a series of operations starting from the condition in which the plurality of devices under test 22 are mounted on the user tray 10 to the process of mounting them back to the user tray after completion of the test of the test apparatus.

The position adjusting section 218 sequentially adjusts the positions of the plurality of devices under test by referring to the reference pins 422, and so when the device mounting section 22 has pushed the test tray 20, the plurality of devices under test 22 will be mounted to the corresponding sockets 122. Therefore, the handler apparatus 100 can mount even several hundreds of devices under test 22 to the sockets 122 automatically and quickly. In addition, so as to mount devices under test 22 having a minute electrode structure to corresponding sockets 122, the handler apparatus 100 may heighten the position detection accuracy of the devices under test 22, the sockets 122, and the reference pins 422 as well as the moving accuracy of the actuator 520, compared to the size and the pitch of the electrodes of the devices under test 22.

Figure 12:
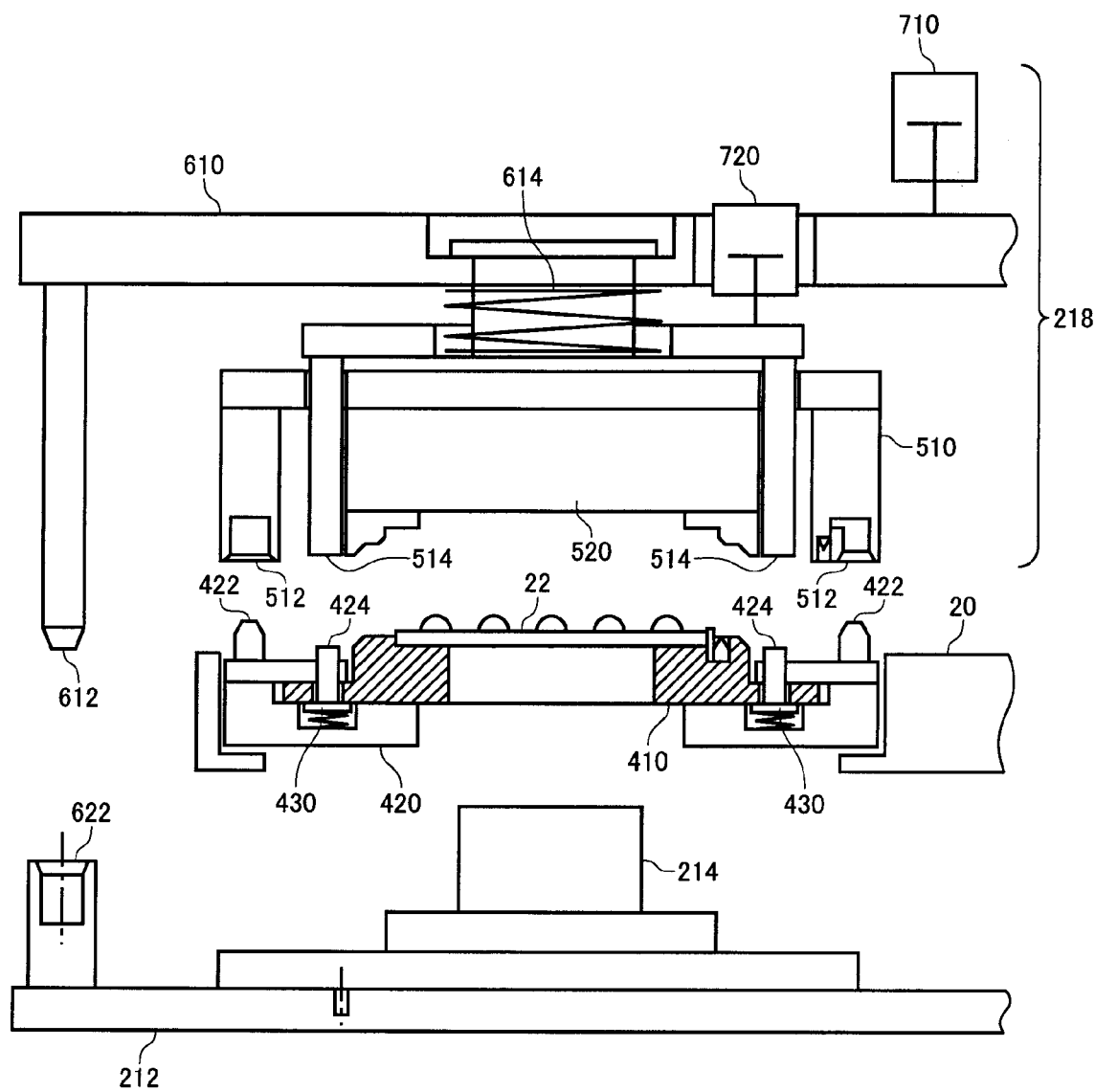
FIG. 12 shows a first modification example of the position adjusting section 218 related to the present embodiment, together with a test tray 20 and a temperature controller 212.
Figure 13:
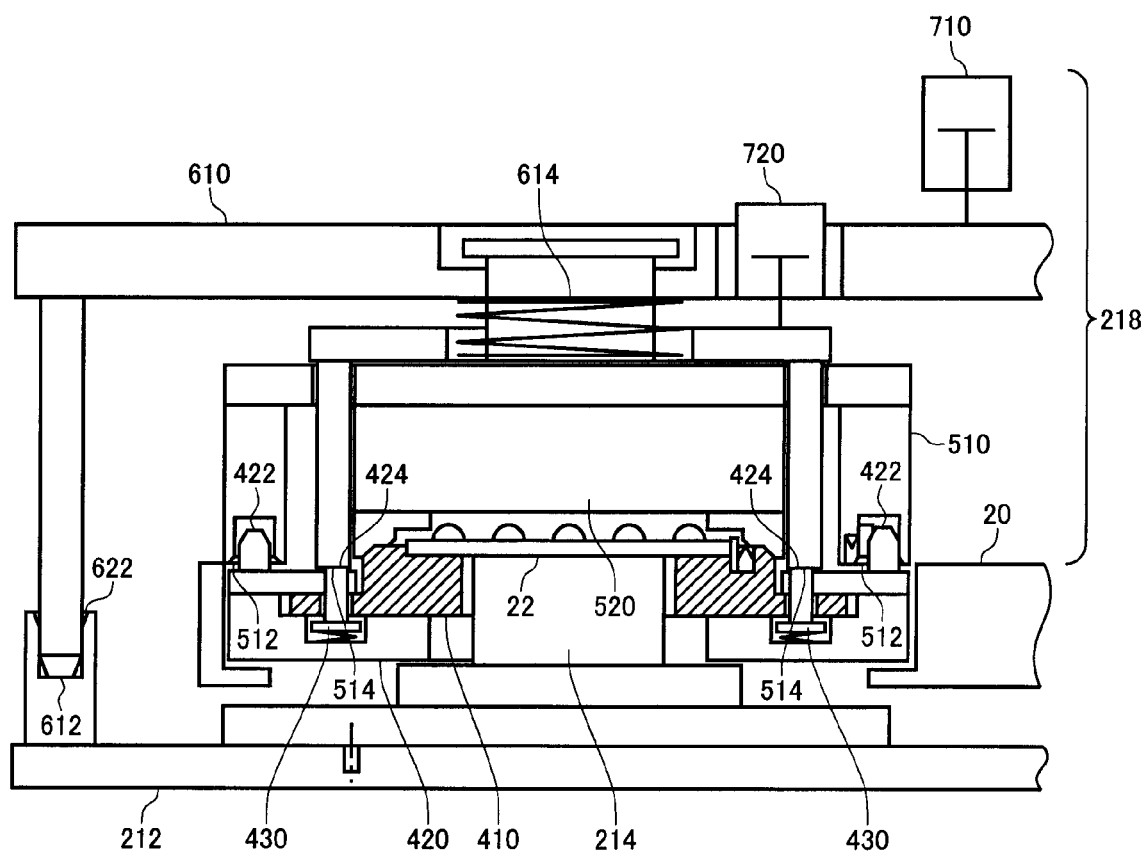
FIG. 13 shows a state in which the first modification example of the position adjusting section 218 related to the present embodiment has retained an outer unit 420 of the test tray 20.

FIG. 12 shows a first modification example of the position adjusting section 218 of the present embodiment, together with a test tray 20 and a temperature controller 212. FIG. 13 shows a state in which the first modification example of the position adjusting section 218 of the present embodiment has been fixed to an outer unit 420 of the test tray 20. The operations of the position adjusting section 218 in this modification example that are the same as those of the position adjusting section 218 of the present embodiment shown FIG. 3 are assigned the same reference numerals, and their explanations are omitted in the following.

The test tray 20 further includes a release pin 424. The release pin 424 is provided on the frame of the outer unit 420, and is pressed by the position adjusting section 218 when releasing the inner unit 410. The release pin 424 may be provided for the outer unit 420 via an elastic spring or the like. While being pressed by the position adjusting section 218, the release pin 424 can release the inner unit 410 thereby canceling the lock.

When the release pin 424 is pressed, the release section 430 of the present embodiment releases the inner unit 410 from pressure. The drawing shows an example in which the release pin 424 is formed integrally with the release section 430.

The temperature controller 212 of the present embodiment further includes a positioning pin inserting section 622. The positioning pin inserting section 622 may be provided at a position at which the relative distance and direction from the plurality of reference pins 422 on the test tray 20 are pre-set. There may be a plurality of positioning pin inserting section 622 provided on the surface of the temperature controller 212 on which the test tray 20 is provided, to determine the position of the position adjusting section 218. When the position of the plurality of devices under test 22 aligned in the row and column directions of the test tray 20 is attempted to be adjusted, the positioning pin inserting section 622 may be provided corresponding to each of the row and column, thereby defining the position of the position adjusting section 218.

The position adjusting section 218 of the present embodiment includes a reference pin inserting section 512, a pin press section 514, and a base section 610. The reference pin inserting section 512 receives a reference pin 422. When the reference pin 422 is inserted to the reference pin inserting section 512, the fixing section 510 is fixed to the reference pin 422. The pin press section 514 may press the release pin 424 in response to fitting of the position adjusting section 218 to the inner unit 410 or to the outer unit 420. As a result, the release section 430 release the lock of the inner unit 410.

The base section 610 fixes the fixing section 510 and the pin press section 514. In addition, the base section 610 includes an actuator 520 that is operable to move in XYZ and θ directions with respect to the base section 610. The base section 610 includes a positioning pin 612, a spring section 614, a driving section 710, and a driving section 720.

The positioning pin 612 is inserted to the positioning pin inserting section 622 of the temperature controller 212, and defines the position of the base section 610 and the reference pin 422 of the test tray 20. That is, when the positioning pin 612 is inserted to the positioning pin inserting section 622, the reference pin 422 of the corresponding test tray 20 is inserted to the reference pin inserting section 512, to fix the fixing section 510. In other words, when the controller 270 inserts the positioning pin 612 of the position adjusting section 218 to the corresponding positioning pin inserting section 622, in accordance with the device under test 22 to be adjusted, the fixing section 510 can be fixed to the reference pin 422 of the outer unit 420 corresponding to the device under test 22.

The spring section 614 is provided between the base section 610 and the fixing section 510, and absorbs the impact or the like that would be generated when the fixing section 510 is in contact with the outer unit 420 to be fitted thereto. In addition, when the fixing section 510 is fitted to the outer unit 420, the spring section 614 adjusts the level of strength used to press in the fixing section 510. The spring section 614 has a spring constant smaller than that of the spring of the release pin 424.

The driving section 710 moves the base section 610 in the XY direction. By the movement by the driving section 710 in the XY direction and the movement by the temperature controller 212 in the Z direction, the position adjusting section 218 adjusts the position of the plurality of devices under test 22 on the test tray 20. The driving section 710 may also move the base section 610 in the θ direction and/or in the Z direction. The driving section 710 may be connected to the controller 270, and receive an instruction from the controller 270 to move the base section 610.

The driving section 720 is connected to the pin press section 514, and moves the pin press section 514. The driving section 720 moves the pin press section 514 towards the test tray 20, presses the releases pin 424, and releases the lock of the inner unit 410. The driving section 720 also moves the pin press section 514 away from the test tray 20, and releases the lock of the inner unit 410. According to the first modification example of the position adjusting section 218 related to the above-described embodiment of the present invention, the fixing section 510 can be accurately fixed to the reference pin 422 corresponding to the device under test 22 that require adjustment.

Figure 14:
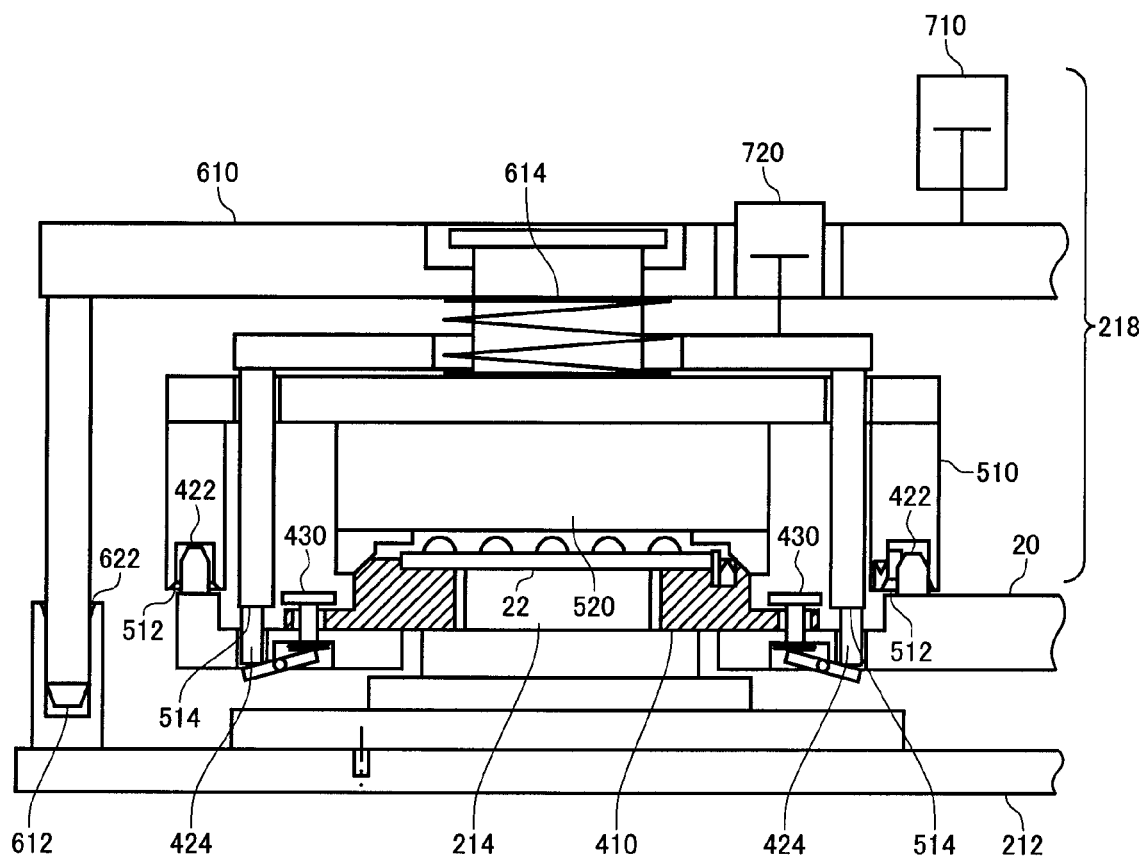
FIG. 14 shows a second modification example of the position adjusting section 218 related to the present embodiment, together with a test tray 20 and a temperature controller 212.

FIG. 14 shows a second modification example of the position adjusting section 218 of the present embodiment, together with a test tray 20 and a temperature controller 212. The operations of the position adjusting section 218 in this modification example that are the same as those of the position adjusting section 218 of the present embodiment shown FIG. 3, FIG. 12, and FIG. 13 are assigned the same reference numerals, and their explanations are omitted in the following.

The test tray 20 according to this modification example includes a release pin 424 and a release section 430 independently from each other. In addition, the present modification example deals with an example in which the test tray 20 has a function of the outer unit, to lock the inner unit 410. The release pin 424 is provided on the test tray 20, and is pushed by the position adjusting section 218 when releasing the inner unit 410. When the release pin 424 is pushed, the release section 430 releases the pushing of the inner unit 410. The release section 430 may be provided for the test tray 20 via an elastic spring or the like. While the release pin 424 is pressed by the position adjusting section 218, the release section 430 can release the inner unit 410 thereby canceling the lock.

Due to this configuration, the test tray 20 can enjoy a greater level of design freedom for the release pin 424 and the release section 430. In addition, since the test tray 20 conveys the pressure that the release pin 424 has received to the release section 430 via a component such as a lever, the level of design freedom for the force applied by the position adjusting section 218 on the release pin 424 will increase. The present modification example has dealt with an example in which the test tray 20 functions as an outer unit. However, the test tray 20 may alternatively include an outer unit.

Figure 15:
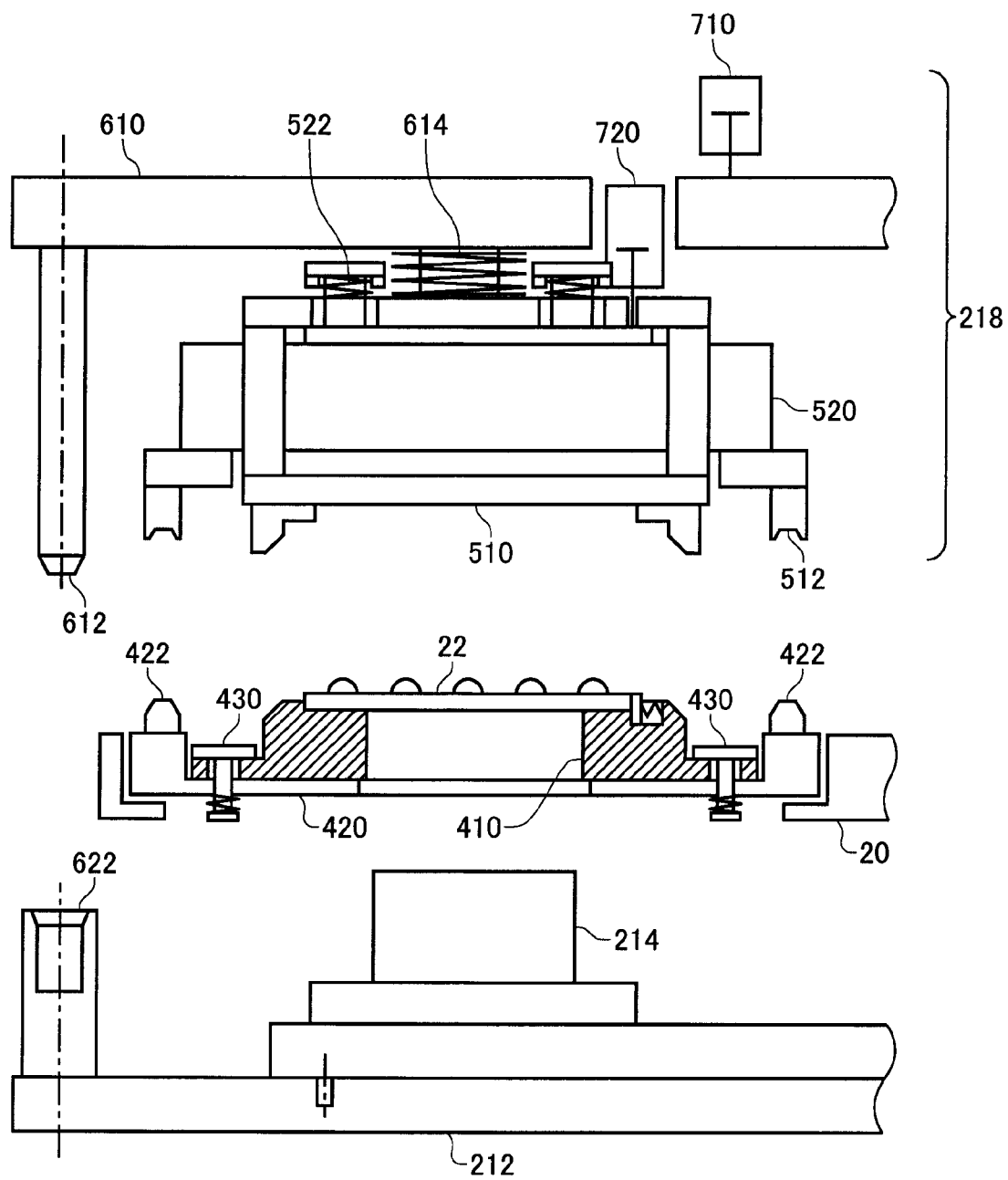
FIG. 15 shows a third modification example of the position adjusting section 218 related to the present embodiment, together with a test tray 20 and a temperature controller 212.
Figure 16:
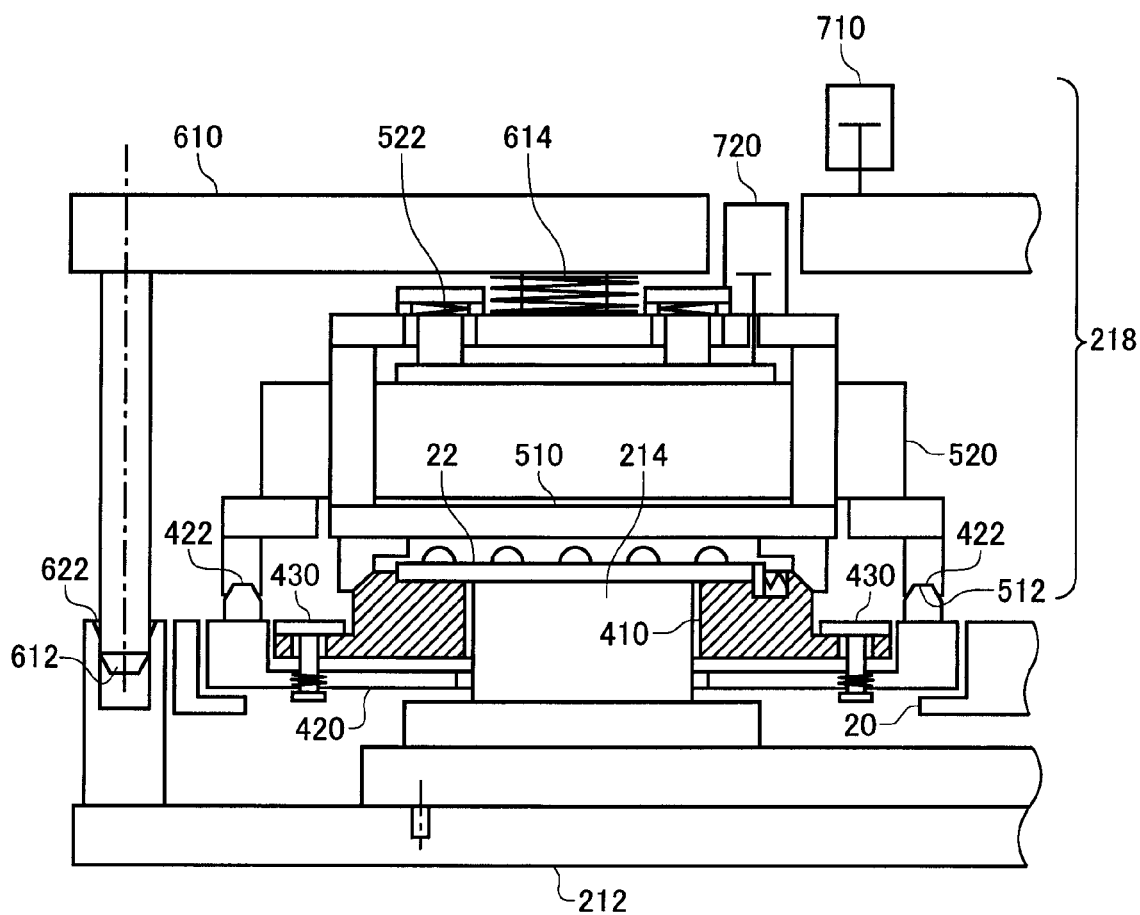
FIG. 16 shows a state in which the third modification example of the position adjusting section 218 related to the present embodiment has fitted to the reference pin 422 of the outer unit 420 of the test tray 20.

FIG. 15 shows a third modification example of the position adjusting section 218 of the present embodiment, together with a test tray 20 and a temperature controller 212. FIG. 16 shows a state in which the third modification example of the position adjusting section 218 of the present embodiment has fitted to the reference pin 422 of the outer unit 420 of the test tray 20. The operations of the position adjusting section 218 in this modification example that are the same as those of the position adjusting section 218 of the present embodiment shown FIG. 3, FIG. 12, and FIG. 13 are assigned the same reference numerals, and their explanations are omitted in the following.

The position adjusting section 218 of the present embodiment moves the outer unit 420, to adjust the position of the plurality of devices under test 22 to the corresponding sockets 122. In other words, the fixing section 510 is fixed to the inner unit 410. In addition, the actuator 520 includes a reference pin inserting section 512, to move the outer unit 420. In addition, the driving section 720 of the present embodiment is connected to the actuator 520 and moves the actuator 520.

For example, when the positioning pin 612 is inserted to the positioning pin inserting section 622, the reference pin 422 of the corresponding test tray 20 will be inserted to the reference pin inserting section 512, thereby fitting the actuator 520 with the outer unit 420. The fixing section 510 is fixed to the inner unit 410. Here, the inner unit 410 may be fixed between the temperature control unit 214 and the fixing section 510 via the device under test 22.

Here, the driving section 720 moves the actuator 520 towards the test tray 20, and presses the reference pin 422 through the reference pin inserting section 512. Accordingly, the release section 430 moves, to release the lock between the inner unit 410 and the outer unit 420.

In response to release of the lock, the actuator 520 moves the outer unit 420. When the actuator 520 has finished moving the outer unit 420, the driving section 720 moves the actuator 520 in the direction opposite to the test tray 20, thereby locking the inner unit 410 to the outer unit 420.

According to the third modification example of the position adjusting section 218 related to the above-described embodiment of the present invention, the test tray 20 may not have to include any release pin 424, and the position adjusting section 218 may not have to include any pin press section 514. In other words, the position adjusting section 218 can have a simplified configuration for adjusting the position of the plurality of devices under test 22.

Figure 17:
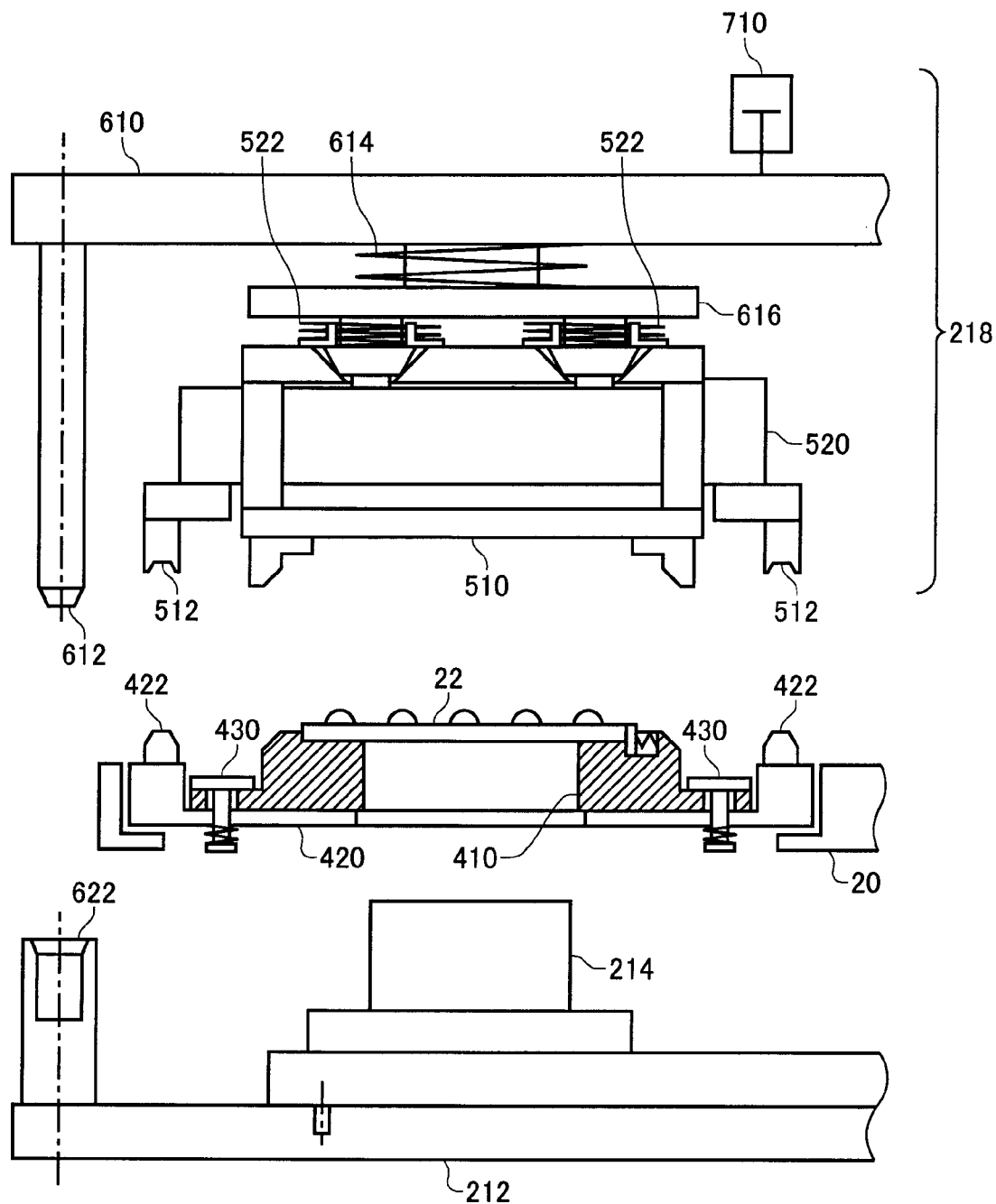
FIG. 17 shows a fourth modification example of the position adjusting section 218 related to the present embodiment, together with a test tray 20 and a temperature controller 212.
Figure 18:
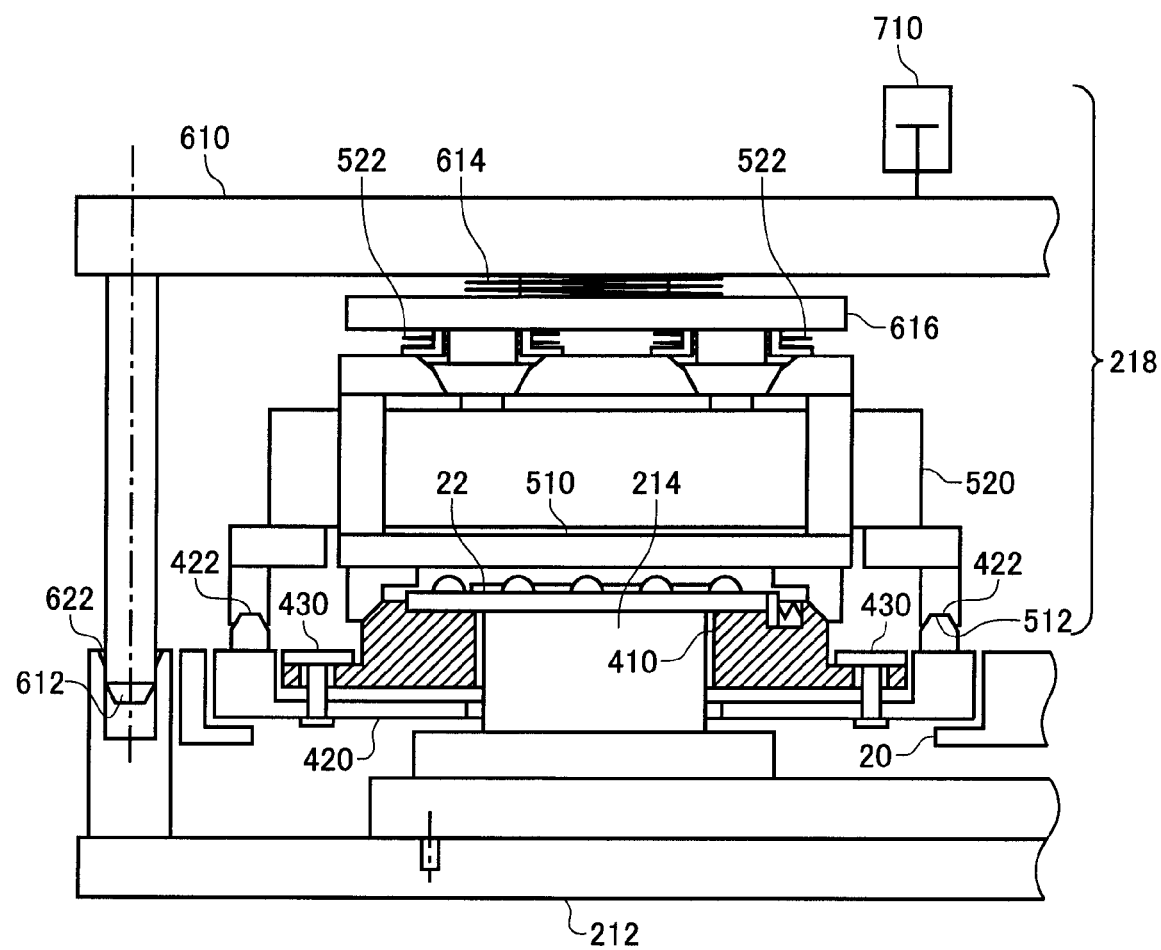
FIG. 18 shows a state in which the fourth modification example of the position adjusting section 218 of the present embodiment has fitted to the reference pin 422 of the outer unit 420 of the test tray 20.

FIG. 17 shows a fourth modification example of the position adjusting section 218 of the present embodiment, together with a test tray 20 and a temperature controller 212. FIG. 18 shows a state in which the fourth modification example of the position adjusting section 218 of the present embodiment has fitted to the reference pin 422 of the outer unit 420 of the test tray 20. The operations of the position adjusting section 218 in this modification example that are the same as those of the position adjusting section 218 of the present embodiment shown FIG. 1, FIG. 15, and FIG. 16 are assigned the same reference numerals, and their explanations are omitted in the following.

Just as in the position adjusting section 218 of the third modification example described above, the position adjusting section 218 of the present embodiment moves the outer unit 420, to adjust the position of the plurality of devices under test 22 to the corresponding sockets 122. The position adjusting section 218 of the present embodiment further includes a spring section 522 having a spring constant larger than that of the spring section 614. In addition, the fixing section 510 moves by contraction of the spring section 522, thereby changing the relative position with respect to the actuator 520. In an example, the fixing section 510 moves in a direction away from the test tray 20 when the spring section 522 has contacted.

Just as the position adjusting section 218 of the third modification example described above, when the positioning pin 612 is inserted to the positioning pin inserting section 622, the reference pin 422 of the corresponding test tray 20 will be inserted to the reference pin inserting section 512, thereby fitting the actuator 520 to the outer unit 420.

Here, when the positioning pin 612 is inserted deeper into the positioning pin inserting section 622, the spring section 614 having a smaller spring constant contracts, thereby fixing the fixing section 510 to the inner unit 410. When the positioning pin 612 is inserted further deeper into the positioning pin inserting section 622, the elasticity of the spring section 614 is substantially equalized to the elasticity of the spring section 522, which would contract the spring section 522. As a result, the fixing section 510 moves in a direction further away from the test try 20 than the actuator 520.

Specifically in this case, the actuator 520 presses the reference pin 422 with the reference pin inserting section 512 therebetween, which would move the release section 430 to release the lock between the inner unit 410 and the outer unit 420. Accordingly, the actuator 520 can move the outer unit 420. In addition, by distancing the positioning pin 612 from the positioning pin inserting section 622 after the actuator 520 has finished moving the outer unit 420, the inner unit 410 can be locked to the outer unit 420.

A single driving section would suffice in the fourth modification example of the position adjusting section 218 related to the present embodiment described above. Therefore, the position adjusting section 218 can have a further simplified configuration to adjust the position of the plurality of devices under test 22.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A handler apparatus for conveying and connecting a plurality of devices under test to a plurality of sockets provided on a test head of a test apparatus, the handler apparatus comprising:

a position adjusting section that moves each of the plurality of devices under test on a test tray and adjusts the position of the device under test to a corresponding one of the plurality of sockets;

a device mounting section that mounts the plurality of devices under test whose positions have been adjusted by the position adjusting section, to the plurality of sockets;

a heating section to which the test tray mounting thereon the plurality of devices under test are loaded prior to undergoing a test; and a test section to which the test tray is loaded from the heating section, the test section being a space in which the plurality of devices under test are tested;

wherein the position adjusting section adjusts the position of each device under test in the heating section.

2. The handler apparatus according to claim 1, wherein the heating section controls the temperature of the device under test prior to a test, to a test temperature, and the position adjusting section adjusts the position of each of the plurality of devices under test whose temperature has been controlled in the heating section.

3. The handler apparatus according to claim 2, further comprising:

a plurality of temperature control sections corresponding to the plurality of devices under test, the plurality of temperature control sections individually heating or cooling each of the plurality of devices under test, from a surface thereof opposite to a terminal surface connected to the socket.

4. The handler apparatus according to claim 1, wherein the position adjusting section includes an actuator that circulates each of two or more of the plurality of devices under test, and adjusts the position of each of the plurality of devices under test to the socket.

5. The handler apparatus according to claim 4, wherein the test tray mounts thereon the plurality of devices under test in row and column directions, and each of a plurality of the actuators provided in the row direction sequentially adjusts the position of the two or more devices under test arranged in the column direction.

6. The handler apparatus according to claim 4, wherein the test tray includes, for each of the plurality of devices under test: an inner unit corresponding to and mounting thereon the device under test, and an outer unit including a lock mechanism to mechanically switch whether to lock the inner unit or to retain the inner unit to be movable, and the position adjusting section uses the lock mechanism to release the inner unit for each of the plurality of devices under test, moves the inner unit relative to the outer unit, and subsequently locks the outer unit by means of the lock mechanism.

7. The handler apparatus according to claim 6, wherein the lock mechanism includes:

a release pin provided on a frame of the outer unit, the release pin being pressed by the position adjusting section when releasing the inner unit, and a release section that releases the inner unit when the release pin is pressed, and the position adjusting section includes a pin press section that presses the release pin in response to being fitted to the inner unit or to the outer unit.

8. The handler apparatus according to claim 6, comprising:

a device image capturing section that captures an image of the inner unit and the outer unit, for each of the plurality of devices under test; and a detecting section that detects a relative position between the inner unit and the outer unit, from the image captured by the device image capturing section, wherein the actuator adjusts the position of the inner unit with respect to the outer unit, based on the detected relative position.

9. The handler apparatus according to claim 8, comprising:

a socket image capturing section that captures an image of each of mounting positions of a plurality of sockets on the test head, wherein the detecting section detects a device under test to be adjusted and an amount in which the device under test to be adjusted is adjusted, by comparing the image captured by the socket image capturing section and the image captured by the device image capturing section.

10. A test method for testing a plurality of devices under test, comprising:

moving each of the plurality of devices under test on a test tray;

loading the test tray mounting thereon the plurality of devices under test into a heating section;

adjusting the position of each of the plurality of devices under test to a corresponding one of a plurality of sockets while the test tray is in the heating section;

loading the test tray from the heating section into a test section, the test section being a space in which the plurality of devices under test are tested;

mounting the plurality of devices under test whose positions have been adjusted, to the plurality of sockets; and testing the plurality of devices under test having been mounted to the plurality of sockets.

* * * * *